(12) United States Patent
Minemura et al.

(10) Patent No.: US 8,154,973 B2
(45) Date of Patent: Apr. 10, 2012

(54) METHOD OF EVALUATING REPRODUCE SIGNAL AND OPTICAL DISC DRIVE

(75) Inventors: Hiroyuki Minemura, Kokubunji (JP); Soichiro Eto, Tokyo (JP); Takahiro Kurokawa, Fujisawa (JP); Shuichi Kusaba, Tokyo (JP)

(73) Assignee: Hitachi Consumer Electronics Co., Ltd., Tokyo (JP)

( * ) Notice: Subject to any disclaimer, the term of this patent is extended or adjusted under 35 U.S.C. 154(b) by 0 days.

(21) Appl. No.: 13/210,429

(22) Filed: Aug. 16, 2011

(65) Prior Publication Data

US 2012/0002526 A1 Jan. 5, 2012

Related U.S. Application Data

(63) Continuation of application No. 12/568,977, filed on Sep. 29, 2009.

(30) Foreign Application Priority Data

Feb. 3, 2009 (JP) .................................. 2009-022112

(51) Int. Cl.
*G11B 5/09* (2006.01)
(52) U.S. Cl. .................................................... 369/59.22
(58) Field of Classification Search ................ 369/59.22
See application file for complete search history.

(56) References Cited

U.S. PATENT DOCUMENTS

| | | | |
|---|---|---|---|
| 7,139,231 B2 | 11/2006 | Nagai et al. | |
| 7,219,296 B2 | 5/2007 | Takehara | |
| 7,221,641 B2 | 5/2007 | Noda et al. | |
| 2003/0067998 A1 | 4/2003 | Nakajima et al. | |
| 2003/0090980 A1 | 5/2003 | Kashihara et al. | |
| 2003/0174622 A1 | 9/2003 | Nagai | |
| 2003/0190041 A1 | 10/2003 | Yokota et al. | |
| 2004/0209293 A1 | 10/2004 | Kashihara et al. | |
| 2005/0249318 A1 | 11/2005 | Minemura | |
| 2006/0087947 A1 | 4/2006 | Minemura et al. | |
| 2006/0280093 A1 | 12/2006 | Nagai et al. | |
| 2007/0086301 A1 | 4/2007 | Yamakawa | |
| 2007/0234188 A1 | 10/2007 | Shiraishi | |

FOREIGN PATENT DOCUMENTS

EP 1 443 509 8/2004

(Continued)

OTHER PUBLICATIONS

H. Minemura, et al., New PRML Method for High-Speed and High-Density Recording, Technical Digest ISOM, Nov. 2003 pp. 34-35.

*Primary Examiner* — Joseph Feild
*Assistant Examiner* — Aneeta Yodichkas
(74) *Attorney, Agent, or Firm* — Antonelli, Terry, Stout & Kraus, LLP.

(57) ABSTRACT

A highly efficient and reliable reproduced signal evaluation method and an optical disc drive using that method in which assuming that the number of 2T's appearing successively in a predetermined evaluation bitstream is i, the evaluation bitstream is divided into a main bitstream (5+2i) long and sub bitstreams at the ends of the main bitstream. The check process to determine whether a predetermined evaluation bitstream is included in the binarized bitstreams is replaced with a main bitstream agreement check. This can prevent an increase in the circuit size. At the same time, by separately summing up for each main bitstream the calculated results of Euclidean distance between the reproduced signal and the target signal corresponding to the evaluation bitstream, the size of an evaluation summing circuit can be reduced.

6 Claims, 39 Drawing Sheets

FOREIGN PATENT DOCUMENTS

| | | |
|---|---|---|
| JP | 2003-141823 | 5/2003 |
| JP | 2003-151219 | 5/2003 |
| JP | 2004-004603 | 1/2004 |
| JP | 2004-253114 | 9/2004 |
| JP | 2005-196964 | 7/2005 |
| JP | 2005-346897 | 12/2005 |
| JP | 2006-318548 | 11/2006 |
| WO | WO 2009/122642 | 10/2009 |

FIG.2

| No. | Pattern A | Pattern B | Euclidian Distance | Hamming Distance |
|---|---|---|---|---|
| 1 | 000001100 | 000011100 | 14 | 1 |
| 2 | 000001110 | 000011110 | 14 | 1 |
| 3 | 000001111 | 000011111 | 14 | 1 |
| 4 | 100001100 | 100011100 | 14 | 1 |
| ... | ... | ... | ... | ... |
| 17 | 111110001 | 111100001 | 14 | 1 |
| 18 | 111110011 | 111100011 | 14 | 1 |
| 19 | 00000110000 | 00001100000 | 12 | 2 |
| 20 | 00000110001 | 00001100001 | 12 | 2 |
| 21 | 00000110011 | 00001100011 | 12 | 2 |
| 22 | 10000110000 | 10001100000 | 12 | 2 |
| ... | ... | ... | ... | ... |
| 35 | 11111001110 | 11110011110 | 12 | 2 |
| 36 | 11111001111 | 11110011111 | 12 | 2 |
| 37 | 0000011001100 | 0000110011100 | 12 | 3 |
| 38 | 0000011001110 | 0000110011110 | 12 | 3 |
| 39 | 0000011001111 | 0000110011111 | 12 | 3 |
| 40 | 1000011001100 | 1000011001100 | 12 | 3 |
| ... | ... | ... | ... | ... |
| 53 | 1111100110001 | 1111001100001 | 12 | 3 |
| 54 | 1111100110011 | 1111001100011 | 12 | 3 |

FIG.3

| No. | Pattern A | Pattern B | Euclidian Distance | Hamming Distance |
|---|---|---|---|---|
| 1 | 00000011000 | 00000111000 | 28 | 1 |
| 2 | 00000011001 | 00000111001 | 28 | 1 |
| 3 | 00000011100 | 00000111100 | 28 | 1 |
| 4 | 00000011110 | 00000111110 | 28 | 1 |
| ... | ... | ... | ... | ... |
| 49 | 11111000110 | 11110000110 | 28 | 1 |
| 50 | 11111000111 | 11110000111 | 28 | 1 |
| 51 | 0000001100000 | 0000011000000 | 20 | 2 |
| 52 | 0000001100001 | 0000011000001 | 20 | 2 |
| 53 | 0000001100011 | 0000011000011 | 20 | 2 |
| 54 | 0000001100110 | 0000011000110 | 20 | 2 |
| ... | ... | ... | ... | ... |
| 99 | 1111100111110 | 1111110011110 | 20 | 2 |
| 100 | 1111100111111 | 1111110011111 | 20 | 2 |
| 101 | 000000110011000 | 000001100111000 | 20 | 3 |
| 102 | 000000110011001 | 000001100111001 | 20 | 3 |
| 103 | 000000110011100 | 000001110111100 | 20 | 3 |
| 104 | 000000110011110 | 000001100111110 | 20 | 3 |
| ... | ... | ... | ... | ... |
| 149 | 111110011000110 | 111110001100110 | 20 | 3 |
| 150 | 111110011000111 | 111110001100111 | 20 | 3 |

FIG.5

| Constrained length | Continuous 2T count and mode name | | | | | | |
|---|---|---|---|---|---|---|---|
| | i=0 (edge) | i=1 (2T1) | i=2 (2T2) | i=3 (2T3) | i=4 (2T4) | i=5 (2T5) | i=6 (2T6) |
| 4 | 16 | 32 | 48 | 64 | 80 | 96 | 112 |
| 5 | 36 | 72 | 108 | 144 | 180 | 216 | 252 |
| 6 | 100 | 200 | 300 | 400 | 500 | 600 | 700 |
| 7 | 256 | 512 | 768 | 1024 | 1280 | 1536 | 1792 |
| 8 | 676 | 1352 | 2028 | 2704 | 3380 | 4056 | 4732 |
| 9 | 1764 | 3528 | 5292 | 7056 | 8820 | 10584 | 12348 |

FIG.6

Constrained length=4, PR(C0,C1,C1,C0)

| No. | Pattern A | Pattern B | Euclidian Distance | Hamming Distance |
|---|---|---|---|---|
| 1-4 | A00011A | A00111B | 10 | 1 |
| 5-8 | A11100A | A11000B | 10 | 1 |
| 9-12 | A0001100A | A0011000B | 12 | 2 |
| 13-16 | A1110011A | A1100111B | 12 | 2 |
| 17-20 | A000110011A | A001100111B | 14 | 3 |
| 21-24 | A111001100A | A110011000B | 14 | 3 |

Constrained length=5, PR(C0,C1,C2,C1,C0)

| No. | Pattern A | Pattern B | Euclidian Distance | Hamming Distance |
|---|---|---|---|---|
| 1-9 | AA00011AA | AA00111AA | 14 | 1 |
| 10-18 | BB11100BB | BB11000BB | 14 | 1 |
| 19-27 | AA0001100BB | AA0011000BB | 12 | 2 |
| 28-36 | BB1110011AA | BB1100111AA | 12 | 2 |
| 37-45 | AA000110011AA | AA001100111AA | 12 | 3 |
| 46-54 | BB111001100BB | BB110011000BB | 12 | 3 |

Constrained length=6, PR(C0,C1,C2,C1,C0)

| No. | Pattern A | Pattern B | Euclidian Distance | Hamming Distance |
|---|---|---|---|---|
| 1-25 | AAA00011BBB | AAA00111BBB | 28 | 1 |
| 26-50 | CCC11100CCC | CCC11000CCC | 28 | 1 |
| 51-75 | AAA0001100CCC | AAA0011000CCC | 20 | 2 |
| 76-100 | DDD1110011BBB | DDD1100111BBB | 20 | 2 |
| 101-125 | AAA000110011BBB | AAA001100111BBB | 20 | 3 |
| 126-150 | CCC111001100CCC | CCC110011000CCC | 20 | 3 |

AAA=000, 011, 100, 110, or 111
BBB=000, 001, 100, 110, or 111
CCC=000, 001, 011, 110, or 111
DDD=000, 001, 011, 100, or 111

FIG.9

| Main Bit Array | | Generation Method for Secondary Likelihood Bit Array | | | $N_{2T}$(*) | Hamming Distance |
|---|---|---|---|---|---|---|
| No. | Most Likelihood | (1) No. of Secondary Likelihood | (2) Bit Inversion Mask | (3) Position of Bit Inversion | | |
| 1-1 | 00011 | 1-2 | 00100 | 3 | 0 | 1 |
| 1-2 | 00111 | 1-1 | | | | |
| 1-3 | 11100 | 1-4 | | | | |
| 1-4 | 11000 | 1-3 | | | | |
| 2-1 | 0001100 | 2-2 | 0010100 | 3, 5 | 1 | 2 |
| 2-2 | 0011000 | 2-1 | | | | |
| 2-3 | 1110011 | 2-4 | | | | |
| 2-4 | 1100111 | 2-3 | | | | |
| 3-1 | 000110011 | 3-2 | 001010100 | 3, 5, 7 | 2 | 3 |
| 3-2 | 001100111 | 3-1 | | | | |
| 3-3 | 111001100 | 3-4 | | | | |
| 3-4 | 110011000 | 3-3 | | | | |
| 4-1 | 00011001100 | 4-2 | 00101010100 | 3, 5, 7, 9 | 3 | 4 |
| 4-2 | 00110011000 | 4-1 | | | | |
| 4-3 | 11100110011 | 4-4 | | | | |
| 4-4 | 11001100111 | 4-3 | | | | |
| 5-1 | 0001100110011 | 5-2 | 0010101010100 | 3, 5, 7, 9, 11 | 4 | 5 |
| 5-2 | 0011001100111 | 5-1 | | | | |
| 5-3 | 1110011001100 | 5-4 | | | | |
| 5-4 | 1100110011000 | 5-3 | | | | |
| 6-1 | 000110011001100 | 6-2 | 001010101010100 | 3, 5, 7, 9, 11, 13 | 5 | 6 |
| 6-2 | 001100110011000 | 6-1 | | | | |
| 6-3 | 111001100110011 | 6-4 | | | | |
| 6-4 | 110011001100111 | 6-3 | | | | |

(*)$N_{2T}$: Continuous 2T count.

FIG.10
Step-1 Detect Main Bit Array
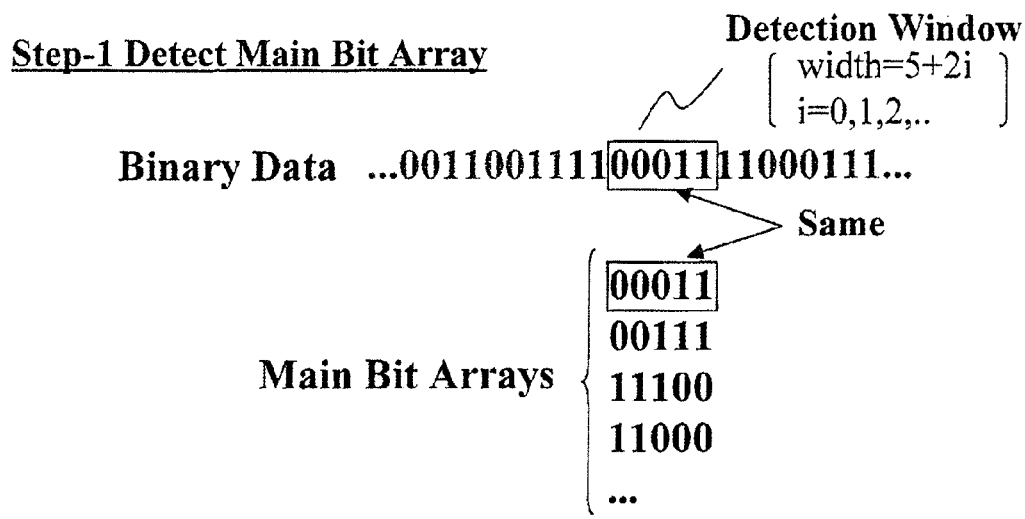
Step-2 Pickup Bit Array for Euclidian Distance Calculations
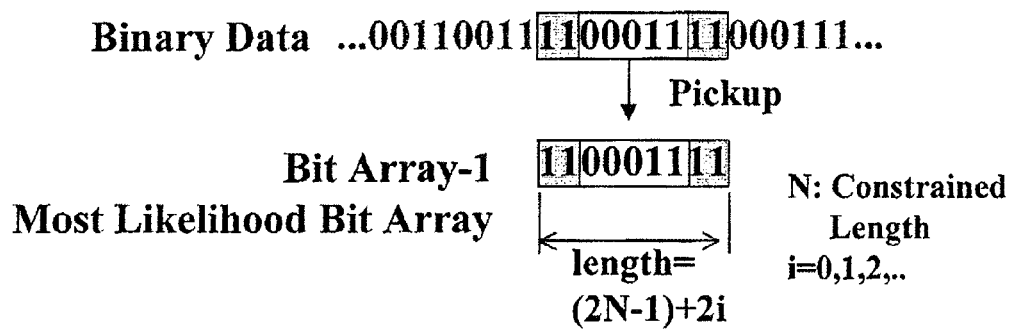
Step-3 Prepare Secondary Most Likelihood Bit Array
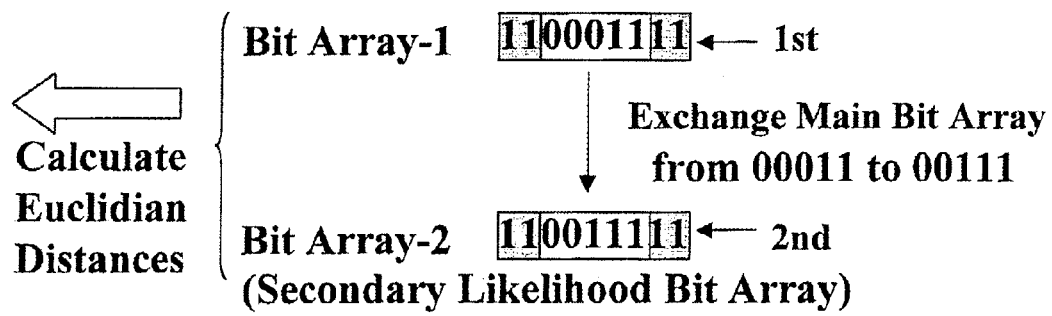

FIG.12

| Main Bit Array | | Generation Method Main Bit Array | | |
|---|---|---|---|---|
| No. | Main Bit Array | Apply Bit Inversion Mask | Full Bit Inversion | Bit Inversion Mask |
| 1-1 | 00011 | – | – | 00100 (position 3) |
| 1-2 | 00111 | yes (1-1) | – | |
| 1-3 | 11100 | – | yes (1-1) | |
| 1-4 | 11000 | – | yes (1-2) | |
| 2-1 | 0001100 | – | – | 0010100 (position 3, 5) |
| 2-2 | 0011000 | yes (2-1) | – | |
| 2-3 | 1110011 | – | yes (2-1) | |
| 2-4 | 1100111 | – | yes (2-2) | |
| 3-1 | 000110011 | – | – | 001010100 (position 3, 5, 7) |
| 3-2 | 001100111 | yes (3-1) | – | |
| 3-3 | 111001100 | – | yes (3-1) | |
| 3-4 | 110011000 | – | yes (3-2) | |
| 4-1 | 00011001100 | – | – | 00101010100 (position 3, 5, 7, 9) |
| 4-2 | 00110011000 | yes (4-1) | – | |
| 4-3 | 11100110011 | – | yes (4-1) | |
| 4-4 | 11001100111 | – | yes (4-2) | |
| 5-1 | 0001100110011 | – | – | 0010101010100 (position 3, 5, 7, 9, 11) |
| 5-2 | 0011001100111 | yes (5-1) | – | |
| 5-3 | 1110011001100 | – | yes (5-1) | |
| 5-4 | 1100110011000 | – | yes (5-2) | |
| 6-1 | 000110011001100 | – | – | 001010101010100 (position 3, 5, 7, 9, 11, 13) |
| 6-2 | 001100110011000 | yes (6-1) | – | |
| 6-3 | 111001100110011 | – | yes (6-1) | |
| 6-4 | 110011001100111 | – | yes (7-2) | |

FIG.15

| Main Bit Array | | Judgment of Binary Data with Detection Window | | | |
|---|---|---|---|---|---|
| No. | Main Bit Array | Detection Window | Left 2 bits (bitL2) | Right 2 bits (bitR2) | Result |
| 1-1 | 00011 | 5bits | 00 | 11 | Match to Main Bit Array 1-1 or 1-2 |
| 1-2 | 00111 | | 00 | 11 | |
| 1-3 | 11100 | | 11 | 00 | Match to Main Bit Array 1-3 or 1-4 |
| 1-4 | 11000 | | 11 | 00 | |
| 2-1 | 0001100 | 7bits | 00 | 00 | Candidate of Main Bit Array 2-1 or 2-2 |
| 2-2 | 0011000 | | 00 | 00 | |
| 2-3 | 1110011 | | 11 | 11 | Candidate of Main Bit Array 2-3 or 2-4 |
| 2-4 | 1100111 | | 11 | 11 | |
| 3-1 | 000110011 | 9bits | 00 | 11 | Candidate of Main Bit Array 3-1 or 3-2 |
| 3-2 | 001100111 | | 00 | 11 | |
| 3-3 | 111001100 | | 11 | 00 | Candidate of Main Bit Array 3-3 or 3-4 |
| 3-4 | 110011000 | | 11 | 00 | |
| 4-1 | 00011001100 | 11bits | 00 | 00 | Candidate of Main Bit Array 4-1 or 4-2 |
| 4-2 | 00110011000 | | 00 | 00 | |
| 4-3 | 11100110011 | | 11 | 11 | Candidate of Main Bit Array 4-3 or 4-4 |
| 4-4 | 11001100111 | | 11 | 11 | |
| 5-1 | 0001100110011 | 13bits | 00 | 11 | Candidate of Main Bit Array 5-1 or 5-2 |
| 5-2 | 0011001100111 | | 00 | 11 | |
| 5-3 | 1110011001100 | | 11 | 00 | Candidate of Main Bit Array 5-3 or 5-4 |
| 5-4 | 1100110011000 | | 11 | 00 | |
| 6-1 | 000110011001100 | 15bits | 00 | 00 | Candidate of Main Bit Array 6-1 or 6-2 |
| 6-2 | 001100110011000 | | 00 | 00 | |
| 6-3 | 111001100110011 | | 11 | 11 | Candidate of Main Bit Array 6-3 or 6-4 |
| 6-4 | 110011001100111 | | 11 | 11 | |

FIG.16

| Group No. | Detection Main Bit Array (Most Likelihood) | Secondary Likelihood Main Bit Array | Group Identification Method | Detection Window | Euclidian Distance | Hamming Distance |
|---|---|---|---|---|---|---|
| 1-1<br>1-2 | 00X11 | 00X11 | 1-1:X=0<br>1-2:X=1 | 5bits | 14 | 1 |
| 1-3<br>1-4 | 11X00 | 11X00 | 1-3:X=1<br>1-4:X=0 | | | |
| 2-1<br>2-2 | 00X1Y00 | 00X1Y00 | 2-1:X=0<br>2-2:X=1 | 7bits | 12 | 2 |
| 2-3<br>2-4 | 11X0Y11 | 11X0Y11 | 2-3:X=1<br>2-4:X=0 | | | |
| 3-1<br>3-2 | 00X1Y0011 | 00X1Y0011 | 3-1:X=0<br>3-2:X=1 | 9bits | 12 | 3 |
| 3-3<br>3-4 | 11X0Y1100 | 11X0Y1100 | 3-3:X=1<br>3-4:X=0 | | | |
| ... | ... | ... | ... | ... | ... | ... |

Group Identification Bits
X=0 or 1
Y=bit inversion of "X"

FIG.17

| Group No. | Detection Main Bit Array (Most Likelihood) | Secondary Likelihood Main Bit Array | Group Identification Method | Detection Window | Euclidian Distance | Hamming Distance |
|---|---|---|---|---|---|---|
| 1-1 | aaXbb | aaYbb | 1-1:X=0, a=0 | 5bits | 14 | 1 |
| 1-2 | | | 1-2:X=1, a=0 | | | |
| 1-3 | | | 1-3:X=1, a=1 | | | |
| 1-4 | | | 1-4:X=0, a=1 | | | |
| 2-1 | aaXaYaa | aaYaXaa | 2-1:X=0, a=0 | 7bits | 12 | 2 |
| 2-2 | | | 2-2:X=1, a=0 | | | |
| 2-3 | | | 2-3:X=1, a=1 | | | |
| 2-4 | | | 2-4:X=0, a=1 | | | |
| 3-1 | aaXbYaabb | aaYbXaabb | 3-1:X=0, a=0 | 9bits | 12 | 3 |
| 3-2 | | | 3-2:X=1, a=0 | | | |
| 3-3 | | | 3-3:X=1, a=1 | | | |
| 3-4 | | | 3-4:X=0, a=1 | | | |
| ... | ... | ... | ... | ... | ... | ... |

<u>Group Identification Bits</u>
  X=0 or 1
  Y=bit inversion of "X"
<u>Group Identification Sub Bits</u>
  a=0 or 1
  b=bit inversion of "a"
<u>Secondly Likelihood Main Bit Array</u>
  Exchange X and Y in the Detected Main Bit Array.

FIG.20
Main Bit Array Group 1
Detected Main Bit Array (Most Likelihood)
Secondary Likelihood Main Bit Array
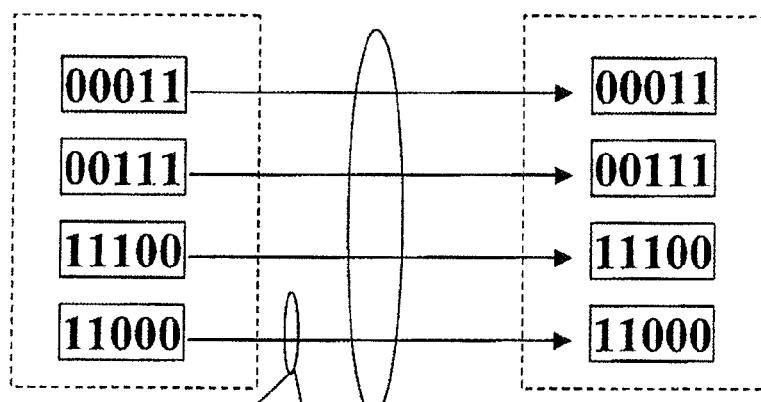
Based on Bitwise Cyclic Rotation
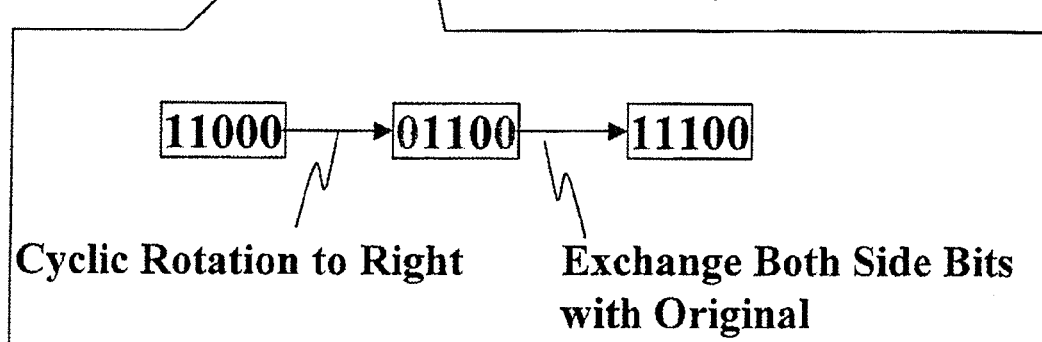
Main Bit Array Group 2
...

FIG.21

Step-1 Detect Main Bit Array

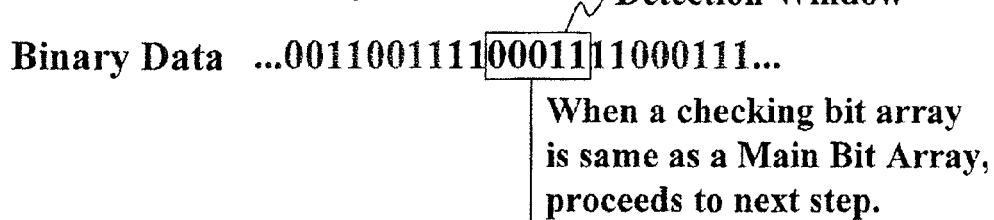

Binary Data ...00110011 11 | 00011 | 1 1000111...

Detection Window

When a checking bit array is same as a Main Bit Array, proceeds to next step.

Step-2 Pickup Bit Array for Euclidian Distance Calculations

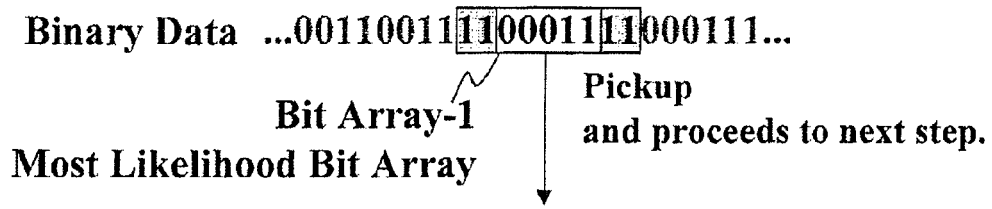

Binary Data ...0011001 | 11 | 00011 | 11 | 000111...

Bit Array-1
Most Likelihood Bit Array

Pickup and proceeds to next step.

Step-3 Prepare Secondary Most Likelihood Bit Array

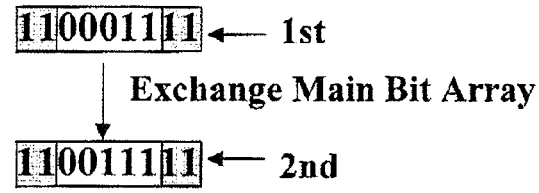

| 11 | 00011 | 11 | ← 1st

Exchange Main Bit Array

| 11 | 00111 | 11 | ← 2nd

Step-4 Run Length Limitation Check

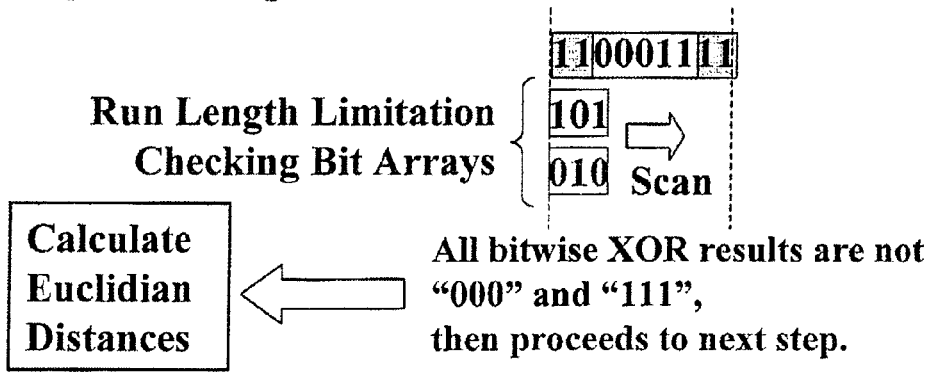

| 11 | 00011 | 11 |

Run Length Limitation Checking Bit Arrays { 101 010 } Scan

Calculate Euclidian Distances ⇐ All bitwise XOR results are not "000" and "111", then proceeds to next step.

FIG.22

Constrained length=5, PR(C0,C1,C2,C1,C0)

| Group No. | Evaluation Bit Array | Main Bit Inversion Mask | Euclidian Distance | Hamming Distance | Shift Direction | Edge/Mark |
|---|---|---|---|---|---|---|
| 1-1 | AA00011AA | 00100 | 14 | 1 | Left | Leading Edge |
| 1-2 | AA00111AA | 00100 | 14 | 1 | Right | Leading Edge |
| 1-3 | BB11100BB | 00100 | 14 | 1 | Left | Trailing Edge |
| 1-4 | BB11000BB | 00100 | 14 | 1 | Right | Trailing Edge |
| 2-1 | AA0001100BB | 0010100 | 12 | 2 | Left | Mark |
| 2-2 | AA0011000BB | 0010100 | 12 | 2 | Right | Mark |
| 2-3 | BB1110011AA | 0010100 | 12 | 2 | Left | Space |
| 2-4 | BB1100111AA | 0010100 | 12 | 2 | Right | Space |
| 3-1 | AA000110011AA | 001010100 | 12 | 3 | Left | Leading Edge |
| 3-2 | AA001100111AA | 001010100 | 12 | 3 | Right | Leading Edge |
| 3-3 | BB111001100BB | 001010100 | 12 | 3 | Left | Trailing Edge |
| 3-4 | BB110011000BB | 001010100 | 12 | 3 | Right | Trailing Edge |

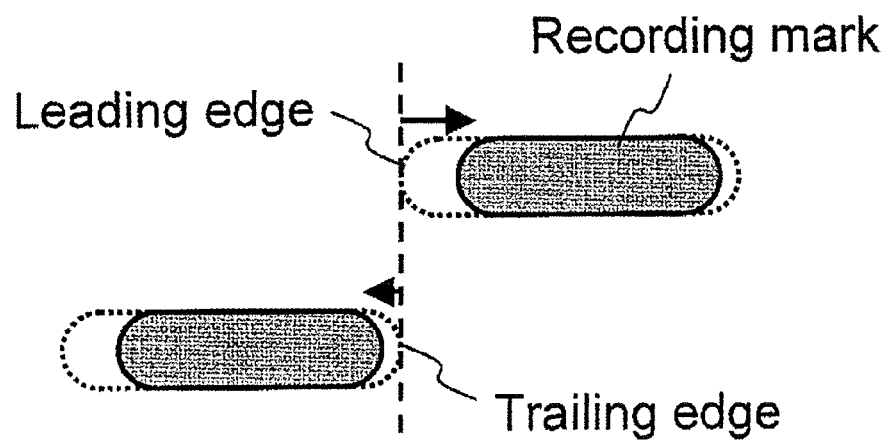

SNR = 22dB

Offset = 0.02/Spp

Phase Shift = 0.10/T

FIG.30

Constrained length=5, PR(C0,C1,C2,C1,C0)

| Group No. | Evaluation Bit Array | Main Bit Inversion Mask | Euclidian Distance | Hamming Distance | Shift Direction | Edge/Mark |
|---|---|---|---|---|---|---|
| 1-1 | AA00011AA | 00100 | 14 | 1 | Left | L-Edge |
| 1-2 | AA00111AA | | | | Right | L-Edge |
| 1-3 | BB11100BB | | | | Left | T-Edge |
| 1-4 | BB11000BB | | | | Right | T-Edge |
| 2-1 | AA0001100BB | 0010100 | 12 | 2 | Left | Mark |
| 2-2 | AA0011000BB | | | | Right | Mark |
| 2-3 | BB1110011AA | | | | Left | Space |
| 2-4 | BB1100111AA | | | | Right | Space |
| 3-1 | AA000110011AA | 001010100 | 12 | 3 | Left | L-Edge |
| 3-2 | AA001100111AA | | | | Right | L-Edge |
| 3-3 | BB111001100BB | | | | Left | T-Edge |
| 3-4 | BB110011000BB | | | | Right | T-Edge |
| 4-1 | AA00011001100BB | 00101010100 | 12 | 4 | Left | Mark |
| 4-2 | AA00110011000BB | | | | Right | Mark |
| 4-3 | BB11100110011AA | | | | Left | Space |
| 4-4 | BB11001100111AA | | | | Right | Space |
| 5-1 | AA0001100110011AA | 0010101010100 | 12 | 5 | Left | L-Edge |
| 5-2 | AA0011001100111AA | | | | Right | L-Edge |
| 5-3 | BB1110011001100BB | | | | Left | T-Edge |
| 5-4 | BB1100110011000BB | | | | Right | T-Edge |
| 6-1 | AA000110011001100BB | 001010101010100 | 12 | 6 | Left | Mark |
| 6-2 | AA001100110011000BB | | | | Right | Mark |
| 6-3 | BB111001100110011AA | | | | Left | Space |
| 6-4 | BB110011001100111AA | | | | Right | Space |

Constrained length=5, PR(C0,C1,C2,C1,C0)

| Group No. | Evaluation Bit Array | Main Bit Inversion Mask | Euclidian Distance | Hamming Distance | Shift Direction |
|---|---|---|---|---|---|
| 1-1 | AA00011AA<br>BB11100BB | 00100 | 14 | 1 | Left |
| 1-2 | AA00111AA<br>BB11000BB | | | | Right |
| 2-1 | AA0001100BB<br>BB1110011AA | 0010100 | 12 | 2 | Left |
| 2-2 | AA0011000BB<br>BB1100111AA | | | | Right |
| 3-1 | AA000110011AA<br>BB111001100BB | 001010100 | 12 | 3 | Left |
| 3-2 | AA001100111AA<br>BB110011000BB | | | | Right |
| ... | ... | ... | ... | ... | ... |

Constrained length=5, PR(C0,C1,C2,C1,C0)

| Group No. | Evaluation Bit Array | Main Bit Inversion Mask | Euclidian Distance | Hamming Distance | Edge/Mark |
|---|---|---|---|---|---|
| 1-1 | AA00011AA<br>AA00111AA | 00100 | 14 | 1 | L-Edge |
| 1-3 | BB11100BB<br>BB11000BB | | | | T-Edge |
| 2-1 | AA0001100BB<br>AA0011000BB | 0010100 | 12 | 2 | Mark |
| 2-3 | BB1110011AA<br>BB1100111AA | | | | Space |
| 3-1 | AA000110011AA<br>AA001100111AA | 001010100 | 12 | 3 | L-Edge |
| 3-3 | BB111001100BB<br>BB110011000BB | | | | T-Edge |
| ... | ... | ... | ... | ... | ... |

Constrained length=5, PR(C0,C1,C2,C1,C0)

| Group No. | Evaluation Bit Array | Main Bit Inversion Mask | Euclidian Distance | Hamming Distance | Direction |
|---|---|---|---|---|---|
| 1-1 | AA00011AA<br>BB11000BB | 00100 | 14 | 1 | Mark Large |
| 1-2 | AA00111AA<br>BB11100BB | | | | Space Large |
| 2-1 | AA0001100BB<br>BB1100111AA | 0010100 | 12 | 2 | Mark Large |
| 2-2 | AA0011000BB<br>BB1110011AA | | | | Space Large |
| 3-1 | AA000110011AA<br>BB110011000BB | 001010100 | 12 | 3 | Mark Large |
| 3-2 | AA001100111AA<br>BB111001100BB | | | | Space Large |
| ... | ... | ... | ... | ... | ... |

AA=00, 10 or 11
BB=00, 01, or 11

Experiment: Blu-ray Disc 33GB/layer
PR(1,2,2,2,1)
Detect Pattern : 4 x 3
Calculation Circuit : 4 x 3 (L/R, L/T)

♦ R-tilt  ■ R-tilt (2T shift)  AF  × SA  ✳ Pw  ● Tan-tilt

Experiment: Blu-ray Disc 33GB/layer
PR(1,2,2,2,1)
Detect Pattern : 4 x 3
Calculation Circuit : 2 x 3 (L/T)

◆ R-tilt  ■ R-tilt (2T shift)  AF  ✕ SA  ✱ Pw  ● Tan-tilt

METHOD OF EVALUATING REPRODUCE SIGNAL AND OPTICAL DISC DRIVE

INCORPORATION BY REFERENCE

This application is a continuation application of application Ser. No. 12/568,977, filed Sep. 29, 2009, which claims priority from Japanese application JP 2009-022112 filed on Feb. 3, 2009, the content of which is hereby incorporated by reference into this application.

BACKGROUND OF THE INVENTION

The present invention relates to a method of evaluating signals reproduced from an optical disc medium, that stores information by forming therein recording marks of different physical properties from other portions thereof, and to an optical disc drive using the method.

A wide range of optical disc media, including CD-R/RW, DVD-RAM, DVD±R/RW, Blu-ray Disc (or BD) and ones with two data layers, has come into wide use. Commonly used optical disk drives compatible with these discs include a so-called DVD super multi-drive that can record and play CD-R/RW, DVD-RAM and DVD±R/RW discs. Drives with sophisticated functions compatible with BD are expected to become more widespread in the future.

As optical discs gain speed and density, the PRML (Partial Response Maximum Likelihood) reproducing method has become an essential technology. In the PRML method, a decoding of signals reproduced from an optical disc into original binary code strings that were recorded in the disc proceeds by adding new binary codes (bits) one after another to a decoded result obtained so far. When a new bit is added, an assessment is made within a decoder as to whether a bitstream with the new bit added is the most likely bitstream. Based on the result of this assessment, the bit to be added next is determined. So, to obtain correct decoded results by the PRML, i.e., to enhance the quality of the reproduced signals that are finally output from the optical disc to a higher-level apparatus, it is important that the accuracy of the evaluation method be enhanced. As one PRML method an adaptive PRML method or compensation PRML method is available which adaptively changes a target signal level according to the reproduced signal. Non-Patent Document 1 "Tech. Digest ISOM '03, pp. 34" shows that the use of the PRML method allows for a density increase to an equivalent of 35 GB of capacity in a drive capable of handling Blu-ray Disc by compensating for asymmetry of the reproduced signal and for thermal interferences during recording. It is also shown that the reproduction performance under the high-density conditions becomes higher as a restraint length (bit length representing a class) of the PRML method used increases.

Also in optical disc drives using the PRML apparatus, it is important, as with the conventional apparatus, to properly learn (1) a reproduction equalization condition, (2) a focus position and a tilt condition and (3) a recording power and a pulse condition. To this end, various parameters need to be optimized using evaluation indices of reproduced signal quality to make these conditions optimum.

As an example of reproduced signal quality evaluation index that is compatible with the PRML method, a technique to evaluate the quality of a reproduced signal by focusing mainly on an edge shift error is disclosed in Patent Document 1 "JP-A-2003-141823" and Patent Document 2 "JP-A-2005-346897".

Patent Document 1 "JP-A-2003-141823" discloses a technique that evaluates the quality of a reproduced signal according to a distribution of |Pa-Pb|, where Pa represents a likelihood corresponding to the most likely state change sequence and Pb represents a likelihood corresponding to the second most likely state change sequence.

Patent Document 2 "JP-A-2005-346897" discloses a reproduced signal evaluation technique that uses a pattern having a virtual 1T run length as an error pattern, in which an edge portion of the reproduced signal shifts left and right, and that, based on the direction of edge shift, determines a difference between coded sequence errors to calculate an amount of edge shift.

Disclosed in Patent Document 3 "JP-A-2005-196964", Patent Document 4 "JP-A-2004-253114" and Patent Document 5 "JP-A-2003-151219" are reproduced signal quality evaluation methods which use a table containing a combination of a correct pattern and an associated erroneous pattern in evaluating the quality of the readout signal. Patent Document 3 and Patent Document 4 disclose a technique that involves calculating differences between a correct pattern Euclidean distance from the reproduced signal and an erroneous pattern Euclidean distance from the reproduced signal, then determining a simulated bit error rate (SbER) from the average of the Euclidean distance differences and a standard deviation, and evaluating the reproduced signal quality based on the SbER. Patent Document 5 discloses a technique to adjust the recording condition so as to make statistical error probability minimal according to the difference between the correct pattern Euclidean distance from the reproduced signal and the erroneous pattern Euclidean distance from the reproduced signal. In a PRML method with a zero target amplitude of a 2T repetition signal, such as a PR(1, 2, 2, 2, 1) method, the frequency of bit errors caused not only by edge shifts but also by 2T shifts and 2T chain collision shifts can no longer be ignored. With Patent Document 3, the quality of reproduced signals can be evaluated by statistically processing the distribution of error probabilities for the correct pattern and erroneous pattern, i.e., for each evaluation bitstream being searched and extracted, and by using an average value and a standard deviation.

PRIOR ARTS

Patent Document 1: JP-A-2003-141823
Patent Document 2: JP-A-2005-346897
Patent Document 3: JP-A-2005-196964
Patent Document 4: JP-A-2004-253114
Patent Document 5: JP-A-2003-151219
Non-Patent Document 1: Tech. Digest ISOM '03, pp. 34

As described in Non-Patent Document 1, to achieve a high density recording equivalent to 30 GB or higher in BD, a PRML method with a restraint length of 5 or greater is used. Under a BD optical system condition (wavelength of 405 nm and object lens numerical aperture of 0.85), increasing the recording density in a line direction results in the amplitude of the 2T repetition signal with the shortest run length becoming zero for the capacity of about 30 GB or more. It is known that PRML methods appropriately applicable for this situation include a PR (1, 2, 2, 2, 1) method having a zero target amplitude of the 2T repetition signal. In such large-capacity optical discs, for evaluation of the quality of reproduced signals, a variety of evaluation techniques based on error probabilities of the PRML method, such as those described in Patent Documents 1-5, may be applied.

The reproduced signal evaluation techniques described in Patent Documents 1-5, though they differ from each other in construction, have as a common technology a process of searching and extracting a most likely evaluation bitstream from among binarized bitstreams output from the PRML decoder. The most likely state change sequence and the second most likely state change sequence described in Patent Document 1 and the correct pattern and erroneous pattern described in Patent Document 3 are the same in that they are target bitstreams used to measure their distances from the reproduced signal. In the following, these are generally referred to as evaluation bitstreams.

The length of evaluation bitstream, M, can be generalized as $M=2N-1+2N_{2T}$, where N is a restraint length of PRML method, and $N_{2T}$ is the number of successive 2T patterns. Here $N_{2T}$ represents integers 0, 1, 2, . . . . According to the previous notation, $N_{2T}=0, 1, 2$ corresponds to edge shift, 2T shift and 2T chain collision shift, respectively. When $N_{2T}$ is 0, 1, 2, 3, 4, 5 and 6, their Hamming distances are 1, 2, 3, 4, 5, 6 and 7 respectively and the Hamming distance between the first and second evaluation bitstreams is $(N_{2T}+1)$. The evaluation bitstreams can easily be enumerated by a mechanical operation of extracting from among $2^M$ bitstreams a relationship between a most likely first evaluation bitstream and a second evaluation bitstream, the second evaluation bitstream corresponding to a target signal from which the Euclidean distance of the first evaluation bitstream is minimal. The accuracy of the binarized bitstreams obtained by the PRML method, i.e., the reproduced signal quality, tends to improve as the restraint length increases. It is considered unavoidable that the restraint length of the PRML method will increase as the signal reproduction conditions become more stringent as in multilayer BD and high-speed reproduction.

FIG. 2 shows an example of evaluation bitstreams for a PR (1, 2, 2, 2, 1) method with a restraint length of 5. Similar evaluation bitstreams are described in Patent Document 4. As shown in the figure, when evaluation bitstreams are searched and extracted from among binarized bitstreams in the PRML decoder using a PRML method with a restraint length of 5 to evaluate the quality of reproduced signals, a total of 54 pairs of evaluation bitstreams, 18 pairs for each Hamming distance, or a total of 108 evaluation bitstreams are listed. In a reproduced signal evaluation circuit, the search and extraction processing on these evaluation bitstreams need to be executed parallelly.

FIG. 3 shows evaluation bitstreams described in the similar notation to the above, which correspond to PR (1, 2, 3, 3, 2, 1) with a restraint length of 6. In the figure, it is seen that there is a total of 300 evaluation bitstreams, classified into groups of 50 pairs for each Hamming distance 1, 2 and 3. In this case, when Hamming distances are 1, 2 and 3, the bit lengths of each evaluation bitstream are 11, 13 and 15, respectively; and the Euclidean distances of evaluation bitstream A and evaluation bitstream B to the target signal are 28, 20 and 20, respectively. To perform search and extraction for all evaluation bitstreams from among binarized bitstreams decoded from the reproduced signals by the PRML method requires a total of 300 matching circuits.

FIG. 4 is a graph showing relationships for different $N_{2T}$ between the restraint length and the number of evaluation bitstreams detected in the PRML method. As shown in the figure, as the restraint length of the PRML method increases, the total number of evaluation bitstreams increases exponentially. It is also seen that when the restraint length $N=9$ and $N_{2T}=6$, the total number of evaluation bitstreams to be searched and extracted is extraordinary large at 12,000 or more. FIG. 5 summarizes the relationships of FIG. 4 in the form of table.

As described above, when the signal quality of PRML is evaluated using evaluation bitstreams, there is a problem that the scale of circuits for processing signals that have been recorded with high density (e.g., in the case of BD, about 30 GB or higher) increases exponentially with an increase in the restraint length of the PRML method. The object of this invention is to provide a reproduced signal evaluation method capable of preventing an increase in the scale of circuit when using the PRML method and of evaluating the quality of reproduced signals with a simple circuit configuration and to provide an optical disc drive using the same.

SUMMARY OF THE INVENTION

Since this invention intends to increase the capacity to 30 GB or higher in a BD system as a base, explanations will be made assuming the shortest run length of modulation codes to be 2T.

A concept to simplify the operation of deciding whether a desired evaluation bitstream exists in binarized bitstreams output from the PRML decoder will be explained by referring to FIG. 6. What is shown in FIG. 6 represents common terms extracted from the evaluation bitstreams of FIG. 2 corresponding to PR (1, 2, 2, 2, 1) with a restraint length of 5 and then rearranged. As shown in the figure, 108 evaluation bitstreams corresponding to Hamming distance 1, 2, 3 can be expressed by 5-, 7-, 9-bit main bitstreams and 2-bit sub bitstreams XX,YY added to both ends of a main bitstream. Here, the main bitstreams are, in the case of Hamming distance of 1, four bitstreams—"00011", "00111", "11100" and "11000"; in the case of Hamming distance of 2, four bitstreams—"0001100", "0011000", "1110011" and "1100111"; and in the case of Hamming distance of 3, four bitstreams—"000110011", "001100111", "111001100" and "110011000". Sub bitstreams AA are "00", "10" or "11" and sub bitstreams BB are "00", "01" or "11". Describing the evaluation bitstreams by rearranging them as described above is an initial step for simplifying an effort to reduce the scale of circuits.

As to the evaluation bitstreams corresponding to PR (1, 2, 2, 1) with a restraint length of 4, there are 24 of them in all. The evaluation bitstreams arranged and classified into the main bitstreams and sub bitstreams in the similar manner are shown in FIG. 7. As shown in the figure, the main bitstreams are, in the case of Hamming distance of 1, four bitstreams—"00011", "00111", "11100" and "11000"; in the case of Hamming distance of 2, four bitstreams—"0001100", "0011000", "1110011" and "1100111"; and in the case of Hamming distance of 3, four bitstreams—"000110011", "001100111", "111001100" and "110011000". They are the same as those shown in FIG. 6. The sub bitstreams A are "0" or "1" and the sub bitstreams B are also "0" or "1".

Similarly, from the evaluation bitstreams corresponding to PR (1, 2, 3, 3, 2, 1) with a restraint length of 6, common terms are extracted and rearranged as shown in FIG. 8. In this case too, the main bitstreams are the same as those shown in FIG. 6. Sub bitstreams AAA are "000", "011", "100", "110" or "111"; sub bitstreams BBB are "000", "001", "100", "110" or "111"; sub bitstreams CCC are "000", "001", "011", "110" or "111"; and sub bitstreams DDD are "000", "001", "011", "100" or "111".

Why the main bitstreams can be determined independently of the restraint length of the PRML method will be explained. In the case where the shortest run length m is 2T, to express that edge shifts cause a one-bit change, the shortest length of bitstreams is two times the shortest run length plus 1, i.e., 2m+1=5 bits. This is what the main bitstream is. Similarly, when generalized by using the number of 2T's that appear in succession in the evaluation bitstreams, $N_{2T}$, the length of the main bitstream is given by $(2m+1+2N_{2T})$. In this way, the main bitstream is considered to be a shortest bitstream that can be determined by the number of successive 2T's appearing in the evaluation bitstream. On the other hand, the length of bitstreams required for the calculation of the Euclidean distance to the reproduced signal is $(2N-1+2N_{2T})$ where N is a restraint length of the PRML method. The difference in length between the two bitstreams is $(2N-1+2N_{2T})-(2m+1+2N_{2T})=2(N-m-1)$. This indicates that the bitstream length difference is always even. For the shortest run length of m=2, this value is 2(N−3). As shown in FIG. 6 through FIG. 8, sub bitstreams are 1, 2 and 3 in length, respectively, for the restraint lengths of 4, 5 and 6. From this, it is seen that the lengths of the sub bitstreams are equal to (N−3). The sub bitstreams, (N−3) in length, added to both ends of a main bitstream and dependent on the restraint length of the PRML method, function as bitstreams to determine boundary conditions for calculating the Euclidean distance. This is why the length of the sub bitstreams does not depend on Hamming distance.

As described above, the use of the main bitstreams, not dependent on the restraint length N of the PRML method, and the sub bitstreams, (N−3) in length, that are added to both ends of the main bitstreams can arrange evaluation bitstreams in an orderly manner.

When seen from a different viewpoint, the sub bitstreams are bitstreams added to a main bitstream in a way that satisfies the limit on the shortest run length in calculating the Euclidean distance between a reproduced signal and a target signal and in order to determine boundary conditions in the Euclidean distance calculation. Thus, the associated part of the binarized bitstreams output from the PRML decoder and the sub bitstreams need to be the same. Generally, in the PRML method compatible with modulation codes whose shortest run length is limited, there is no state in the decoder less than the shortest run length. Nor do the binarized bitstreams output as a result include a bitstream less than the shortest run length. So, the first and second evaluation bitstream generated to include sub bitstreams are automatically formed by extracting and copying sub bitstreams from the associated parts of the binarized bitstreams. With this concept, it is seen that the bitstreams to be searched and extracted from the binarized bitstreams need only to be the main bitstreams shown above.

The above explanations are summarized.

(1) Evaluation bitstreams can be expressed as a sum of a main bitstream and sub bitstreams attached to both ends of the main bitstream (outside the start bit and end bit of the main bitstream).

(2) There are four patterns of main bitstream for each Hamming distance. The length of main bitstreams is determined by the shortest run length and the number of shortest run lengths occurring in succession, i.e., $(2m+1+2N_{2T})$, and does not depend on a restraint length N of PRML.

(3) Sub bitstreams are equal to bitstreams at associated portions of binarized bitstreams. The length of evaluation bitstreams is (N−3) where N is a restraint length.

Using these allows for a decision on the evaluation bitstream simply by checking whether the portion of the binarized bitstream being investigated matches the main bitstream. A process of determining a first evaluation bitstream, which is the most likely bitstream, involves checking whether the main bitstream of interest exists among the binarized bitstreams output from the PRML decoder and, if so, sub bitstreams of the predetermined length may be copied from the binarized bitstreams and used.

Next, a method of generating a second evaluation bitstream, which is the second most likely bitstream, will be explained.

FIG. 9 shows a summary of operations to generate the second main bitstream. In a column of main bitstream or array, the main bitstreams shown above are listed. From the relationship between the main bitstreams and sub bitstreams described above, the second evaluation bitstreams can be generated by replacing the first main bitstream included in the first evaluation bitstream with a second main bitstream whose Euclidean distance is minimal. Four main bitstreams that exist for each Hamming distance are called a main bitstream group and assigned a group number of the same value as the Hamming distance. At the same time, the four main bitstreams included in the same main bitstream group are given category numbers 1, 2, 3 and 4 successively. The main bitstreams are identified by a group number-category number sequence which is called a main bitstream number, such as No. 1-1 and 1-2 as shown.

The method of generating the second main bitstream, as shown in the figure, can easily be realized by referring to the first main bitstream number and the associated second main bitstream number.

Similarly, the second main bitstream can be realized by inverting predetermined bits in the main bitstream. For example, inverting a third bit of No. 1-1 main bitstream "00011" results in a main bitstream "00111" being formed which matches No. 1-2. Further, inverting a third bit and fifth bit of No. 2-1 "0001100" generates a bitstream "0011000" that matches No. 2-2. As described above, by performing the same bit inversion operation for each Hamming distance, associated main bitstreams can be generated. In the figure, bitstream inversion masks representing bitstreams to be inverted are also shown. For instance, the bitstream inversion mask may be expressed such as "00100" and "0010100", with 1 representing the bit positions to be inverted.

According to the above explanation, a method for simplifying the process of checking an evaluation bitstream in binarized signal is schematically shown in FIG. 10. The evaluation bitstream check according to this invention is performed in the following steps as shown in the figure.

(Step-1)

A detection window, 5+2i bits long where i is a non-negative integer and equal in bit length to the main bitstreams, is opened in binarized bitstreams output from the PRML decoder to check for a match with the main bitstreams. Here, i has the same meaning as the aforementioned $N_{2T}$ and is expressed as i=(Hamming distance)−1.

In the example of FIG. 10, a detection window 5 (=5+2×0) bits long was used to check for a match with the main bitstreams corresponding to Hamming distance 1, i.e., "00011", "00111", "11100" and "11000". A match was found with the main bitstream "00011". For other Hamming distances the similar match decision is also performed on the associated main bitstreams.

(Step-2)

If a bitstream that matches a main bitstream appears in the detection window, a portion matching the main bitstream and two (N−3)-bit sub bitstreams at both ends of that portion are extracted from the binarized bitstream to form a first evaluation bitstream.

In the example of FIG. 10, the main bitstream "00011" found to match with the detection window bitstream was sliced off along with an adjoining sub bitstream on the left side "11" and an adjoining sub bitstream on the right side "11" to generate a first evaluation bitstream "110001111".

(Step-3)

Next, a predetermined operation is performed on the first main bitstream portion included in the first evaluation bitstream to transform it into a corresponding second main bitstream to generate a second evaluation bitstream.

In the example of FIG. 10, the main bitstream "00011" in the first evaluation bitstream "110001111" was transformed into a main bitstream "00111", generating a second evaluation bitstream "110011111".

The most likely first evaluation bitstream and the second most likely second evaluation bitstream, both generated as described above, are transferred to a Euclidean distance calculation circuit to determine a Euclidean distance to a reproduced signal.

The simplification of the evaluation bitstream judgment procedure with this method produces the following effect. For example, when a restraint length is 5, there are three left sub bitstreams and three right sub bitstreams. This is equivalent to implementing the check on 3×3=9 evaluation bitstreams at one time, producing an effect of reducing the number of evaluation bitstreams to be checked to ⅑. Thus, as the restraint length increases, the effect of the simplification becomes more remarkable because the greater the restraint length, the higher the number of different sub bitstreams.

Referring to FIG. 5, the effect of this method will be described. If the restraint length of the PRML method is 9 and if only edge shift errors (i=0) are to be evaluated, the total number of evaluation bitstreams is 1,764 and the same number of check and extraction circuits is needed. With this method, on the other hand, since only the main bitstreams need to be inspected, four check and extraction circuits are required. It is seen that this invention can drastically reduce the size of the circuits.

An evaluation circuit according to the reproduced signal evaluation method of this invention can easily be realized. The use of this evaluation circuit allows for the provision of an optical disc drive of a simple construction that can evaluate reproduced signals.

As described above, with this invention, it has been proven to be feasible to drastically shrink the circuit size, provide a method for evaluating the quality of reproduced signals with a simple circuit configuration and also provide an optical disc drive using this evaluation method. To realize a high-density recording at 30 GB or higher in BD, a PRML method with a restraint length of 5 or more is considered to be required for securing a necessary reproduced signal accuracy. Therefore the present invention is considered particularly effective to a signal reproduction process that applies the above PRML method with a restraint length of 5 or more, such as PR (1, 2, 2, 2, 1) method.

Other objects, features and advantages of the invention will become apparent from the following description of the embodiments of the invention taken in conjunction with the accompanying drawings.

BRIEF DESCRIPTION OF THE DRAWINGS

FIG. 2 is an evaluation bitstream table compatible with PR (1, 2, 2, 2, 1).

FIG. 3 is an evaluation bitstream table compatible with PR (1, 2, 3, 3, 2, 1).

FIG. 5 is a table of relation between a restraint length and the number of evaluation bitstreams.

FIG. 6 is a feature-extracted evaluation bitstream table (pattern table) compatible with PR (1, 2, 2, 1).

FIG. 7 is a feature-extracted evaluation bitstream table (pattern table) compatible with PR (1, 2, 2, 2, 1).

FIG. 8 is a feature-extracted evaluation bitstream table (pattern table) compatible with PR (1, 2, 3, 3, 2, 1).

FIG. 9 is a table of operations for generating first main bitstreams and second main bitstreams.

FIG. 10 is a schematic diagram for simplifying a process of checking evaluation bitstream patterns.

FIG. 12 is a conversion table for main bitstreams.

FIG. 15 is a decision table based on two bits at each end.

FIG. 16 is an evaluation bitstream table compatible with PR (1, 2, 2, 2, 1).

FIG. 17 is an evaluation bitstream table compatible with PR (1, 2, 2, 1).

FIG. 20 is a schematic diagram showing a method of generating second main bitstreams.

FIG. 21 is a schematic diagram showing a run length violation inspection method.

FIG. 22 is an evaluation bitstream table compatible with PR (1, 2, 2, 2, 1).

FIG. 23 is a schematic diagram showing shifts of recording marks.

FIG. 30 is an evaluation bitstream table compatible with PR (1, 2, 2, 2, 1).

FIG. 32 is an evaluation bitstream table compatible with PR (1, 2, 2, 2, 1).

FIG. 34 is an evaluation bitstream table compatible with PR (1, 2, 2, 2, 1).

FIG. 36 is an evaluation bitstream table compatible with PR (1, 2, 2, 2, 1) (group table).

DETAILED DESCRIPTION OF THE EMBODIMENTS

Referring to the accompanying drawings, a method of evaluating reproduced signals and an optical disc drive according to this embodiment will be described.

To explain the technology of this embodiment for simplifying a check process of deciding whether binarized data stream contains a part that matches a main bitstream, relations among main bitstreams are summarized in FIG. 12. Main bitstream lengths are M=5, 7, 9, ..., and they are assigned group numbers 1, 2, 3, ..., respectively. Here, the main bitstream lengths M are expressed as $M=5+2N_{2T}$ where $N_{2T}$ is the number of successive 2T's included in the main bitstream. These correspond to Hamming distance=M+1 to be evaluated. As shown in the figure, there are four main bitstreams for each main bitstream group. These are assigned category numbers 1, 2, 3, 4. If main bitstream numbers are defined in the form of group number-category number, they are, as shown in the figure, 1-1, 1-2, 1-3, 1-4, 2-1, .... Thus all the main bitstreams can be assigned unique identification numbers.

Here two bitstream operations will be defined. A first bitstream operation is a bit inversion of an element at a particular position. This is called a bitstream mask inversion operation. Let us consider bitstream inversion masks "00100", "0010100", ... and then the bitstream mask inversion operation is defined as an operation to invert between "1" and "0" the value of an element of a main bitstream at a position where the value of the bitstream inversion mask is 1. If the bit element values are assumed to be 1, 2, 3, ... from left to right (i.e., in the order of decoding time beginning with the oldest), the bitstream mask inversion operation is equivalent to inverting the bit element value (3+2i) (i=0, 1, 2, ..., M−5) where i is a non-negative integer and M is a length of a main bitstream. The second bitstream operation is an operation to invert the values of all elements of a main bitstream between "1" and "0". This is called an all-bit inversion operation.

The relationships among the category numbers of main bitstreams can be rearranged in an orderly manner using the above two bitstream operations. The use of the bitstream inversion mask operation makes it possible to obtain, for example, main bitstream numbers 1-2, 1-4 by performing the bitstream inversion mask operation on main bitstream numbers 1-1, 1-3. As for the all-bit inversion operation, main bitstreams 1-3, 1-4, for example, can be obtained by performing the all-bit inversion operation on main bitstreams 1-1, 1-2. Also for main bitstream group 2 and subsequent ones, other main bitstreams can be obtained similarly by using main bitstream category number 1 in each group and the bitstream inversion mask operation and the all-bit inversion operation. By using these relationships, the process of searching and checking main bitstreams included in binarized data streams can be simplified. Examples are shown below.

Figure 13:
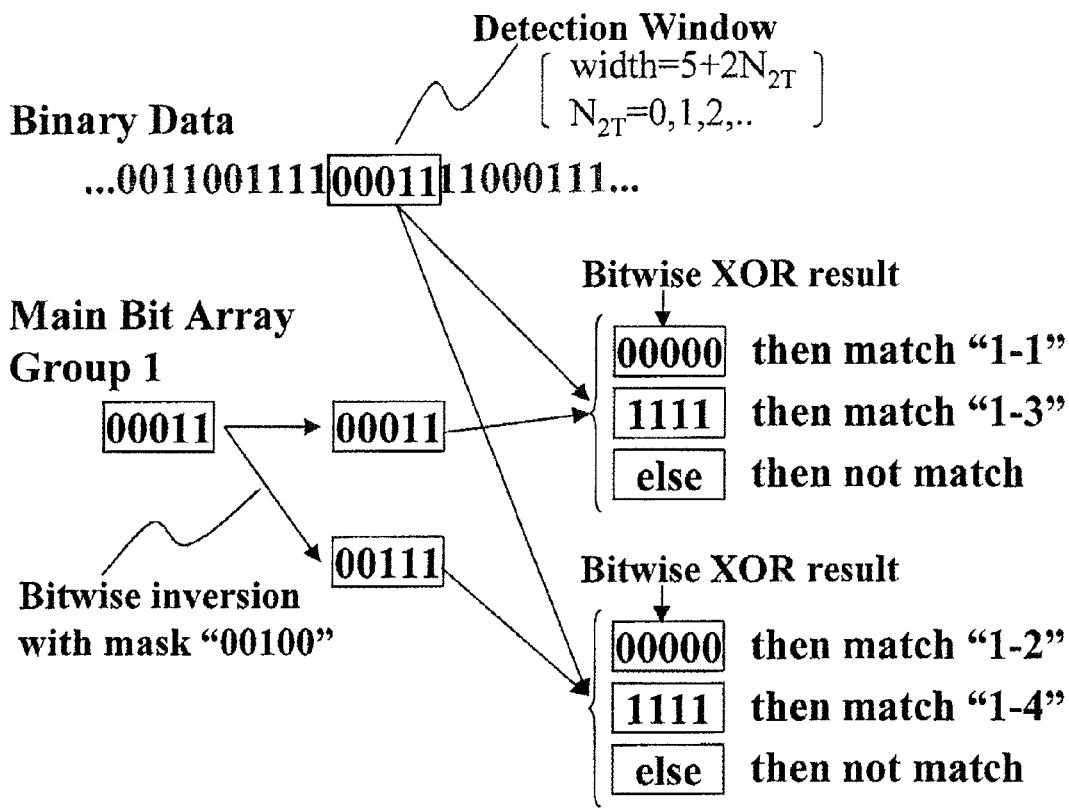
FIG. 13 is a schematic diagram for a main bitstream checking method.

FIG. 13 is a schematic diagram showing a main bitstream search and decision method. A detection window having the same length as that M of main bitstreams being checked is used to extract a matching portion from binarized bitstreams output from the PRML decoder. Here, the main bitstream group number G is $N_{2T}+1$. Of the main bitstreams belonging to the group number G, category numbers 1 and 3, and also 2 and 4 are used because they are in the all-bit inversion relationship. In the figure, a decision process for a main bitstream group 1 is shown. Executing a bit-to-bit XOR operation on the main bitstream category numbers 1-1, 1-2, that are to be checked for a match with a binarized bitstream in the detection window, can easily decide that, if the result is "000000", the binarized bitstream matches the main bitstream number 1-1 or 1-2 and that, if the result is "11111", the bitstream totally disagrees, i.e., it matches main bitstream number 1-3 or 1-4. Performing the same operation on other main bitstream groups can determine whether a matching main bitstream is included in the binarized data stream. New data is added to the binarized bitstream every moment, causing one-bit-shifted binarized data string to enter into the detection window. So, by performing this decision operation in succession, for all binarized data streams, it is possible to determine which main bitstream is included in which of the binarized data streams.

Figure 14:
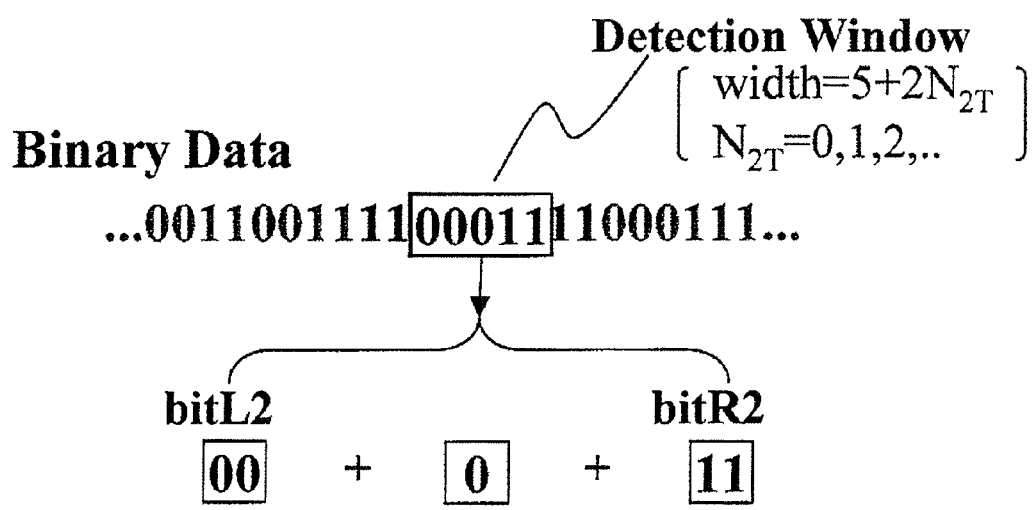
FIG. 14 is a schematic diagram for a main bitstream checking method.

FIG. 14 is a schematic diagram showing another method for main bitstream search and check. Here the fact that the value of two successive bits at each end of the main bitstreams listed in FIG. 12 is "00" or "11" is used. When binarized data streams are inspected using the detection window as described above, if the value of two successive bits at the ends is neither "00" nor "11", then the main bitstreams are not included. If, however, the value of two successive bits at the ends is "00" or "11", it is possible to narrow down candidates of main bitstreams that are likely to match. This is because the main bitstream identification numbers 1 and 3, and 2 and 4 are in the all-bit inversion relationship. Relations between the values of successive two bits at the ends and main bitstream candidates for possible match are summarized in FIG. 15. As shown in the figure, in the case of main bitstream group 1, if the value of two bits on the left side (the side where time is latest) is "00" and the right side two bits have a value of "11", a main bitstream matching candidate is main bitstream number 1-1 or 1-2. Conversely, if two bits on the left side are "00" and two bits on the right side "11", the matching candidate is main bitstream number 1-3 or 1-4. Particularly, the left end of the detection window (two bits on the data side where time is latest) is a check portion common to all main bitstream groups. So, the decision result for this group can be used commonly in all main bitstream groups. Therefore, if this value is found neither "00" nor "11" in a check performed beforehand on the value of two bits at the left end of the detection window, no matching main bitstream exists, allowing the following decision operation to be omitted. Further, because the binarized data stream output from the PRML decoder basically satisfies the run length limitation, as described above, it is possible from the relationship of FIG. 15 to narrow candidate main bitstreams down to two by using only the value of two bits at the left end of the detection window.

Using the above-mentioned relationships, the decision making circuit to check whether a binarized data stream has a portion that matches main bit strings can be reduced in size.

Next, in a case where a binarized data stream has a portion matching a predetermined main bitstream, a method for generating a most likely state change, i.e., a first evaluation bitstream, and a second most likely state change, i.e., a second evaluation bitstream for which the Euclidean distance is minimal, will be described.

It is assumed that the restraint length of the PRML decoder is N and a main bitstream present in the binarized data stream is a first main bitstream. The first evaluation bitstream described above is (2N−1) long and contains a first main bitstream included in the binarized data. The corresponding second evaluation bitstream has the first main bitstream in the first evaluation bitstream replaced with a second main bitstream whose Euclidean distance is closest. So, the main part of the method for generating the first and second evaluation bitstreams is a process of generating the corresponding second main bitstream from the first main bitstream.

Figure 18:
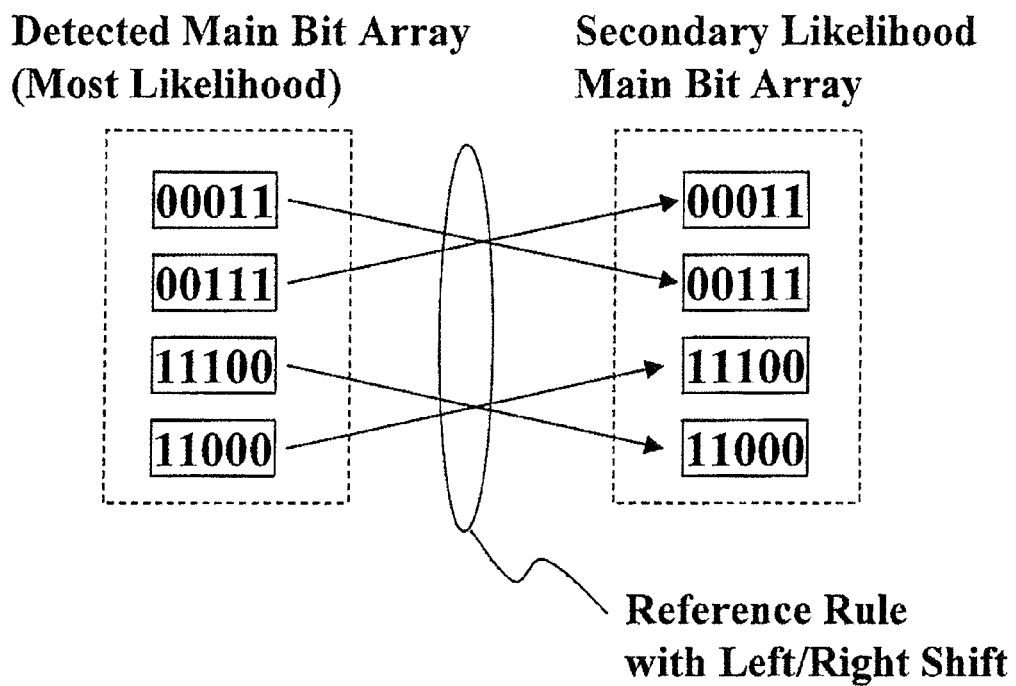
FIG. 18 is a schematic diagram showing a method of generating second main bitstreams.

In the drawings used in this embodiment, including FIG. 12, bitstreams are arranged and shown in an orderly manner that causes the main bitstream identification numbers 1 and 2 and also the main bitstream identification numbers 3 and 4 to have their minimal Euclidean distances. Therefore, the process of generating the second main bitstream whose Euclidean distance from the first main bitstream is minimal can be implemented, as shown in FIG. 18, by selecting the corresponding second main bitstream according to the identification number of the first main bitstream included in the binarized data stream. If the identification numbers of the main bitstreams shown in FIG. 12 are used as address information, for example, the second main bitstream can be uniquely determined by, as shown in FIG. 18, listing all main bitstreams and then selecting a main bitstream whose address corresponds to that of the first main bitstream. Implementing this method on actual circuits may be accomplished by using a reference table having main bitstream values and address information as well as address information of the corresponding second main bitstreams.

Figure 19:
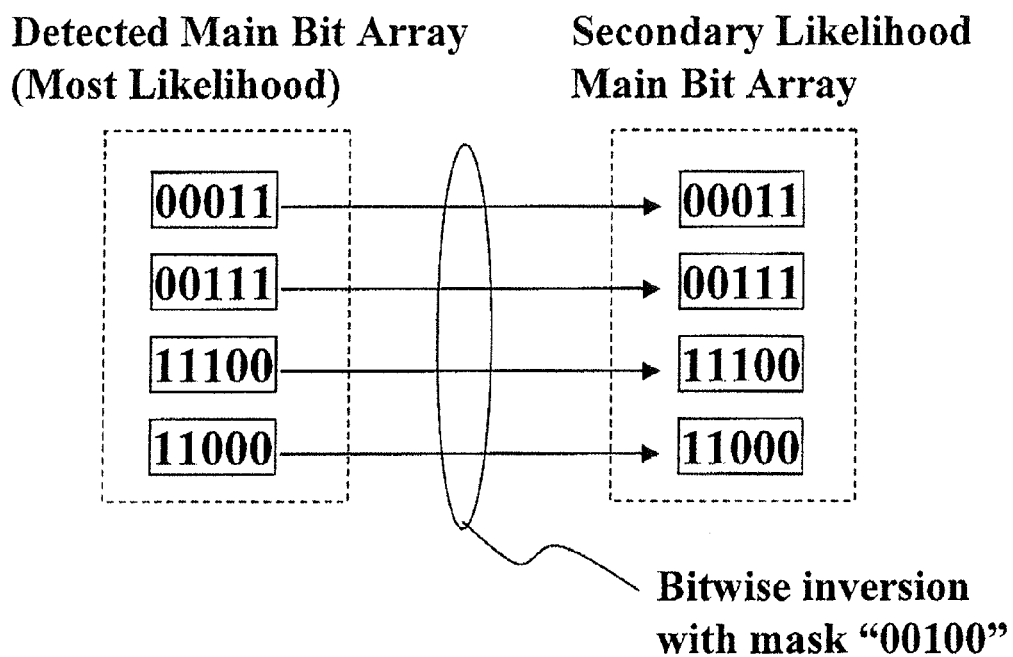
FIG. 19 is a schematic diagram showing a method of generating second main bitstreams.

As described above, the main bitstream identification numbers 1 and 2 and also the main bitstream identification numbers 3 and 4 are in a relationship where they can be mutually transformed by the bitstream mask inversion operation. Using this relationship, it is possible to generate second main bitstreams by performing the bitstream mask inversion operation on the first main bitstreams. FIG. 19 schematically shows a method of generating second main bitstreams by the bitstream mask inversion operation. Such an operation can easily be implemented on the circuit by using a bit-to-bit XOR operation.

FIG. 20 shows another example of the method for generating the second main bitstreams. Generally, a bit shift operation is one kind of operation that can execute processing at the highest speed among the numerical operations handled by CPU. When there are a plurality of PRML restraint lengths and modulation codes to be handled, or when recording conditions are adjusted by using special recording data patterns for media evaluation, it is often desirable that the second main bitstreams be generated by the CPU. In such cases, generating the second main bitstreams using the shift operation as a basic operation allows for minimizing an increase in the processing time. If bit elements of a second main bitstream are denoted, from left to right, b[1], b[2], b[3], . . . , b[M-2], b[M-1], b[M], the bit elements of the second main bitstream will, as FIG. 12 shows, be either b[1], b[1], b[2], . . . , b[M-3], b[M-2], b[M] based on the bit shift operation toward left, or b[1], b[3], b[4], . . . , b[M-1], b[M], b[M] based on the bit shift operation toward right. The former represents the case where the bitstream category numbers are 1 and 3, while the latter represents the case where the bitstream identification numbers are 2 and 4. The figure schematically shows a cyclic type bit shift operation performed on the main bitstreams and an operation of replacing the value of end bits with the original main bitstream value.

Next, another method of expressing the main bitstream according to this embodiment will be explained. FIG. 16 shows another example of main bitstream groups in this embodiment. Here, taking into consideration the fact that the Euclidean distance between the main bitstream identification numbers 1 and 2 or 3 and 4 is minimal, the non-matching bit elements are denoted "X". In the figure, bit element values "Y" represent inverted bits of "X". This representation allows for detecting common bit elements, excluding disagreeing bits. At the same time, it is also possible to schematically show the method of generating the second main bitstream by using the first main bitstream.

FIG. 17 is a table of main bitstreams in this embodiment, which uses disagreeing bit elements "X" and "Y" in FIG. 16 and denotes as "aa" and "bb" those main bitstreams with minimal Euclidean distance that have equal bitstream element values. Here, "aa" represents a 2-bit value and "bb" is an inversion of "aa". As shown in the figure, the recognition of the main bitstream category number can be uniquely determined by the value of the non-matching bit "X" and the value of the matching bits "aa". Considering these two independent values to be a 2-bit address value makes it possible to distinguish four main bitstreams by giving them unique addresses. By implementing such a relationship in circuits, the circuit configuration can be simplified.

Next, an example of application of the main bitstream-based classification to the quality evaluation of reproduced signals will be described. As a comparison example, another quality evaluation based on SbER (Simulated bit Error Rate) method will also be explained. The SbER method involves determining, for most likely evaluation bitstreams or first evaluation bitstreams and second most likely evaluation bitstreams or second evaluation bitstreams, a difference (D value) in Euclidean distance between the reproduced signals and the target signals corresponding to these evaluation bitstreams, then determining a distribution of the D values for every first evaluation bitstream, and then calculating (estimating) bit error rates using distribution averages, standard deviations and Hamming distances. In the SbER method, this estimated bit error rate is an indicator representing the likelihood of state change. The first evaluation bitstreams and the second most likely evaluation bitstreams or second evaluation bitstreams are kept in the form of table, for instance. As described above, as optical discs grow higher in density increasing the restraint length of the PRML method used, the number of evaluation bitstreams increases exponentially.

In this embodiment, it has been shown feasible to reduce the size of the circuit drastically by introducing four main bitstreams for every Hamming distance and generating first and second evaluation bitstreams according to a result of decision as to whether a binarized data stream includes the main bitstream as its part. Application of this method to the evaluation of reproduced signals makes it possible to substantially reduce the scale of the evaluation circuit while keeping the equivalent evaluation performance. In the following explanation, a PR (1, 2, 2, 2, 1) method with a restraint length of 5 is used as the PRML method.

In the PR (1, 2, 2, 2, 1) method, there are a total of 54 pairs of first evaluation bitstream and second evaluation bitstream, i.e., a total of 108 evaluation bitstreams, as shown in FIG. 2. To determine a distribution for each of the 108 evaluation bitstreams in all, circuits for calculating corresponding 108 average values and standard deviations are required. FIG. 22 shows evaluation bitstreams, rearranged into 12 combinations of a main bitstream and two 2-bit sub bitstreams AA and BB at both ends of the main bitstream. Here, a main bitstream category number 1 includes "00011", "0001100" and "000110011"; a main bitstream category number 2 includes "00111", "0011000" and "1110011"; a main bitstream category number 3 includes "11100", "001100111" and "111001100"; and a main bitstream category number 4 includes "11000", "1100111" and "110011000". The 2-bit sub bitstream AA is either "00", "10" or "11; and the sub bitstream BB is either "00", "01" or "11". To generate second evaluation bitstreams from first evaluation bitstreams requires performing the bitstream inversion mask operation using bit inversion masks "00100", "0010100" and "001010100" for each group and using the inverted main bitstreams as the second evaluation bitstreams.

With the above rearrangement method in mind, the meaning of FIG. 22 will be discussed. Here, if we consider a binarized value "1" to be a marked portion and "0" a space portion (unrecorded portion) according to a general concept of information recording into optical disc media, the evaluation of a main bitstream category number 1 corresponds to the evaluation of a probability of error of a main bitstream number 1 becoming a main bitstream number 2, representing a shift of the leading edge of a mark or a 2T mark toward left (negative side in a time direction). Similarly, the evaluation of a main bitstream category number 2 corresponds to the evaluation of a probability of error of a main bitstream number 2 becoming a main bitstream number 1, representing a shift of the leading edge of a mark or a 2T mark toward right (positive side in a time direction). The evaluation of a main bitstream category number 3 corresponds to the evaluation of a probability of error of a main bitstream number 3 becoming a main bitstream number 4, representing a shift of the trailing edge of a mark or a 2T space toward left. Similarly, the evaluation of a main bitstream category number 4 corresponds to the evaluation of a probability of error of a main bitstream number 4 becoming a main bitstream number 3, representing a shift of the trailing edge of a mark or a 2T space toward right. The group number 1 (=odd number) concerns the evaluation on a shift of the leading or trailing edge of a mark. The group number 2 (=even number) concerns the evaluation on a shift of the mark or space. The group number 3 (=odd number) can be considered to be an evaluation associated with the shift of the leading and trailing edges of a mark, as with the group number 1, if the 2T mark and the 2T space adjoining the 2T mark are taken together as one mark. In the same way, if the group number (=Hamming distance) is odd, it is considered to be an evaluation of the leading and trailing edges of a mark; and if the group number is even, it is considered to be an evaluation of the shift of a mark or space.

Information to be stored in an optical disc medium is stored in the form of physically different states, such as pits and spaces, or crystal and amorphous. Here, it is a known fact that, for a variety of reasons, the state with the highest reliability of recorded information is not necessarily symmetrical in a level direction and in a time direction as is the target signal of the PRML method. As a result, asymmetries and edge shifts remain in the reproduced signals obtained from an optical disc medium.

A mechanism of how asymmetry occurs is well known, so the remaining edge shifts will be explained by referring to FIG. 23. FIG. 23 is a schematic diagram showing an edge of a mark recorded with an optimum recording power (broken line) and an edge of a mark recorded with less than the optimum recording power (painted black). When the recording power is not enough, both of the leading edge and training edge of a mark shift in a direction that shortens the mark. That is, the leading edge shifts to right in the figure and the trailing edge to left. In a recording type optical disc, recording marks are formed with a radiation of a focused laser beam, so the amount of edge shift caused by variations in the recording power differs between the leading edge and the trailing edge. This is because the amount of shift of the leading edge is directly influenced by a reduction in the recording power, whereas the amount of shift of the trailing edge is not easily influenced by the reduced recording power when compared with the leading edge due to a heat accumulation during the recording of a mark. Although, for the sake of simplicity of explanation, the difference in the residual shift between the leading and trailing edges caused by power variations has been described, the actual recording process has discrete recording pulse durations, such as T/16 and T/32, which means that residual edge shifts are unavoidable. Further, depending on characteristics of a recording material, application of an excessive power, for example, may render the formation of marks unstable, which in turn may increase the wobbling of edges, degrading the quality of reproduced signals. In such recording materials, forming the recording marks somewhat shorter than required can improve the stability of the system. As described above, depending on the recording power variations, residual adjustment errors of recording pulses and characteristic differences among different recording materials, edge shifts remain in the marks actually recorded in an optical disc medium and their shift amount differs between the leading and trailing edges.

Using reproduced signals obtained by a linear diffractive optical simulator, the influences that (a) SNR, (b) asymmetry and (c) edge shift have on the equality evaluation of the reproduced signals will be discussed. Here, the optical system conditions of the linear diffractive optical simulator include a wavelength of 405 nm and an object lens numerical aperture of 0.85 and the recording mark conditions include a mark width of 0.22 μm, a mark reflectivity of 1%, space reflectivity of 10% and a length, corresponding to detection window width T, of 56 nm (equivalent to BD line recording density of 33 GB). White noise was applied to the reproduced signals obtained from the linear diffractive optical simulator to change SNR of the reproduced signals. For the processing of reproduced signals, a conventional equalizer conforming to BD standard was used as an analog signal filter, with its boost amount set at 12 dB. As the PRML method, PR (1, 2, 2, 2, 1) was used; and a FIR (Finite Impulse Response) filter with 21 taps was used as an automatic equalizer.

If reproduced signals have offsets in a level direction, the length of individual marks changes. So, evaluation of the marks can be made for different error types by classifying, for each Hamming distance, the marks into a group of direction in which the mark increases and a group of direction in which the mark decreases. This corresponds to a case where the reproduced signals have asymmetry. Here, if edge shifts remain, their influences will be investigated by giving a phase shift in a time direction to the reproduced signals. That is, the influences of SNR will be evaluated by the application of white noise, those of asymmetry will be evaluated as offset in a level direction, and those of edge shifts will be evaluated as phase shifts in a time direction. Where a phase shift was given to reproduced signals, in order to prevent a possible cancellation of the applied phase shift by the aforementioned automatic equalizer, a limitation was imposed so that a coefficient of each tap would have symmetric values in a time direction with respect to the center. It is noted here that such a limitation is effective, for example, in the adjustment of recording pulses or of tangential tilt of a disc.

In order to prevent the center of distribution of D value from varying according to the group number (=Hamming distance) of a main bitstream, the D value will be represented as a value normalized by Euclidean distance 14, 12, 12 between the first and second evaluation bitstreams.

Figure 24A:
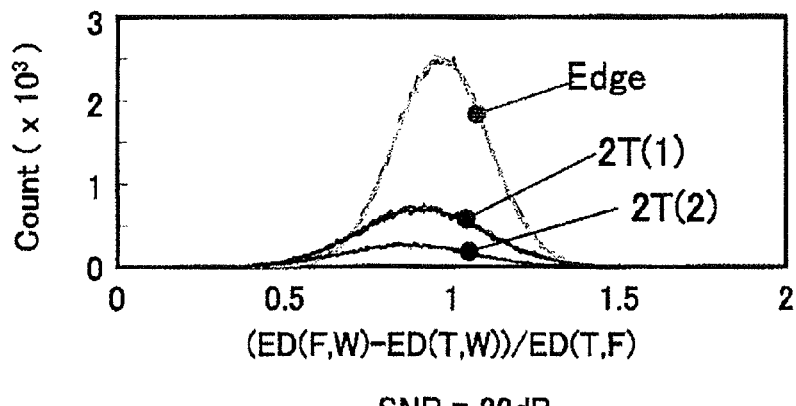
FIGS. 24A, 24B and 24C are D-value distribution diagrams.
Figure 24B:
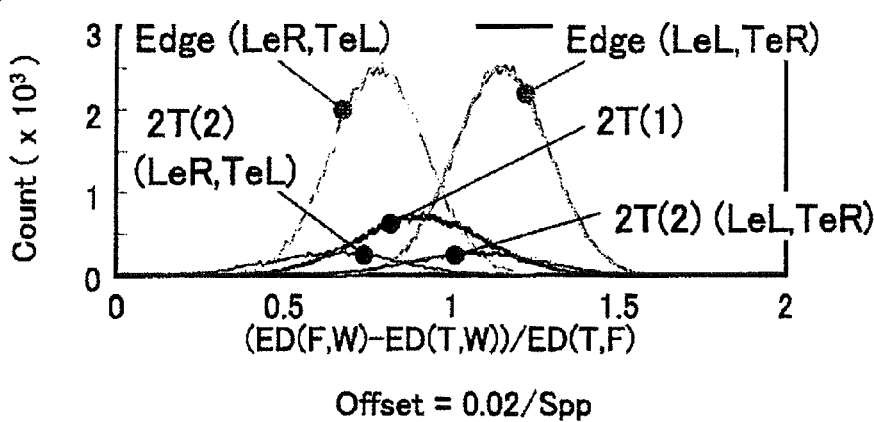
Figure 24C:
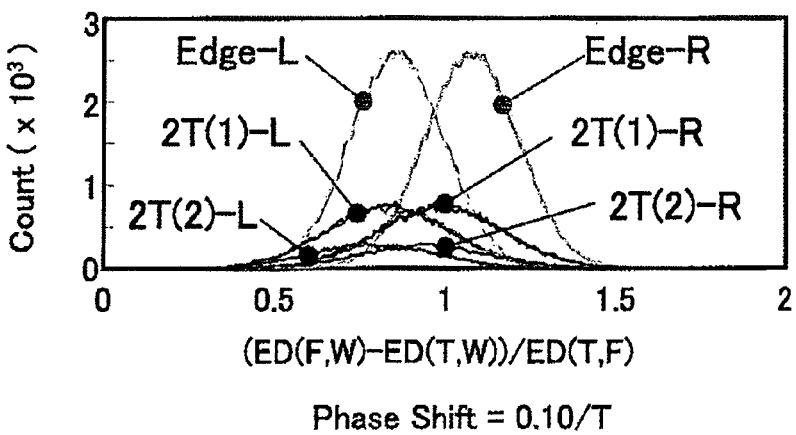

FIGS. 24A, 24B and 24C show results of calculation of D value distributions when there are SNR, offsets and phase shifts. Here, the SNR is a standard deviation ratio between a one-side amplitude of reproduced signals and the applied white noise, and it was set to −22 dB. In the figures, the D value distribution is denoted "Edge" for Hamming distance 1; for Hamming distance 2, it is denoted "2T(1)" because it includes one 2T; and for Hamming distance 3, it is denoted "2T(2)" because it includes two 2T's. As shown in FIG. 24A, when neither offset nor phase shift is applied to the reproduced signals, "Edge", "2T(1) and "2T(2)" are each distributed like one Gauss distribution. The fact that the center value of each distribution is deviated from an ideal value (=1) is considered to be caused by residual equalization errors of an automatic equalizer. Actually, it has been caused by the equalization power of the automatic equalizer being finite and by the Euclidean distance between the reproduced signal and the first evaluation bitstream becoming larger than zero due to white noise. The amount of this deviation, however, is at a negligible level except under the high density conditions that have been discussed here. Further discussions on this problem go beyond the range of this embodiment, so detailed explanations will not be made here. It is noted that the distributions shown in the figures are close to actual distributions obtained during the evaluation of reproduced signals.

FIG. 24B shows distributions when there are offsets in a level direction. It schematically shows a case where the amount of offset for the amplitude of reproduced signal is 0.02. In the figure, a symbol "LeL" represents a leading edge shift toward left; "LeR" a leading edge shift toward right; "TeL" a trailing edge shift toward left; and "TeR" a trailing edge shift toward right. It is seen from the figure that the distributions "Edge" and "2T(2)" are each split into two distributions, one in a direction that increases the mark (LeL and TeR) and one in a direction that decreases the mark (LeR and TeL). The distribution "2T(1)", however, does not split but remain as one distribution. This is because the four groups included in Hamming distance 2 of FIG. 22 are each evaluated for lateral shifts of the 2T mark and 2T space but not for a change in size of mark and space. It is seen that while the SbER method has formed six distributions, the method of this embodiment does not.

FIG. 24C shows distributions when there are phase shifts in a time direction. It shows an example case in which the amount of phase shift is 10% of the detection window width T. In the figure, a symbol "−L" represents a shift toward left and "−R" a shift toward right. As shown in the figure, each of the three distributions "Edge", "2T(1)" and "2T(2)" splits into two distributions "−L" and "−R". It should be noted here that six distributions obtained here differ in the grouping condition from those obtained in FIG. 24B.

In the cases where there are SNR, offsets and phase shifts, a correlation between the actual bit error rate calculated by simulation and the SbER will be discussed. Grouping conditions in which comparison is made are the following four conditions.

(1) All 108 Evaluation Bitstreams Independence

For each of 108 (36×3) evaluation bitstreams, SbER is calculated independently and these are summed up to determine a total SbER. This is considered to be the best for the relation between the bit error rate and the SbER, though the circuit size is large.

Figure 25:
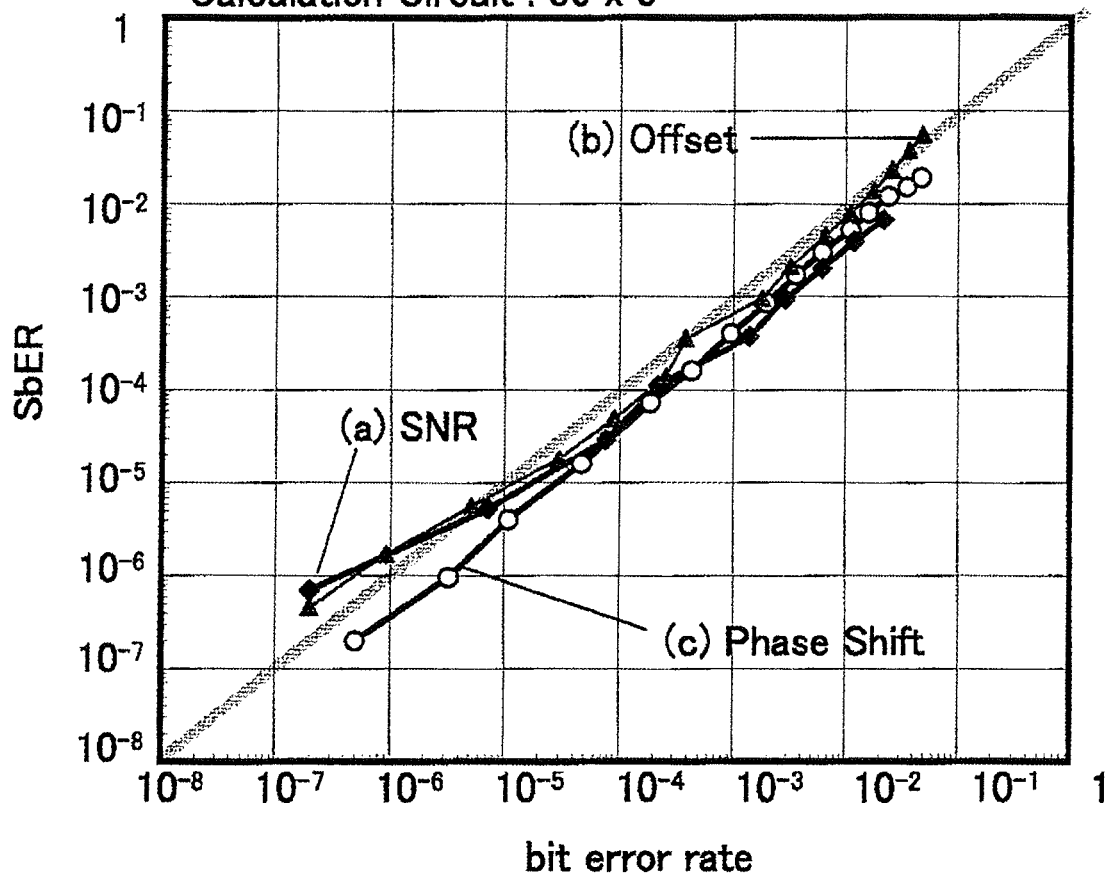
FIG. 25 is a diagram showing a correlation between a bit error rate and SbER.

FIG. 25 shows a result of simulation. It is seen from this figure that the bit error rate and the SbER have a good correlation for all of (a) SNR, (b) offset and (c) phase shift.

(2) 6 Evaluation Bitstreams Independence depending on Mark Size Change

As described above, the evaluation bitstreams are classified into a group that increases the mark and a group that decreases it, forming two groups for each Hamming distance and producing a total of six groups. The circuit size is reduced to 1/18 the size required when all evaluation bitstreams are handled independently.

Figure 26:
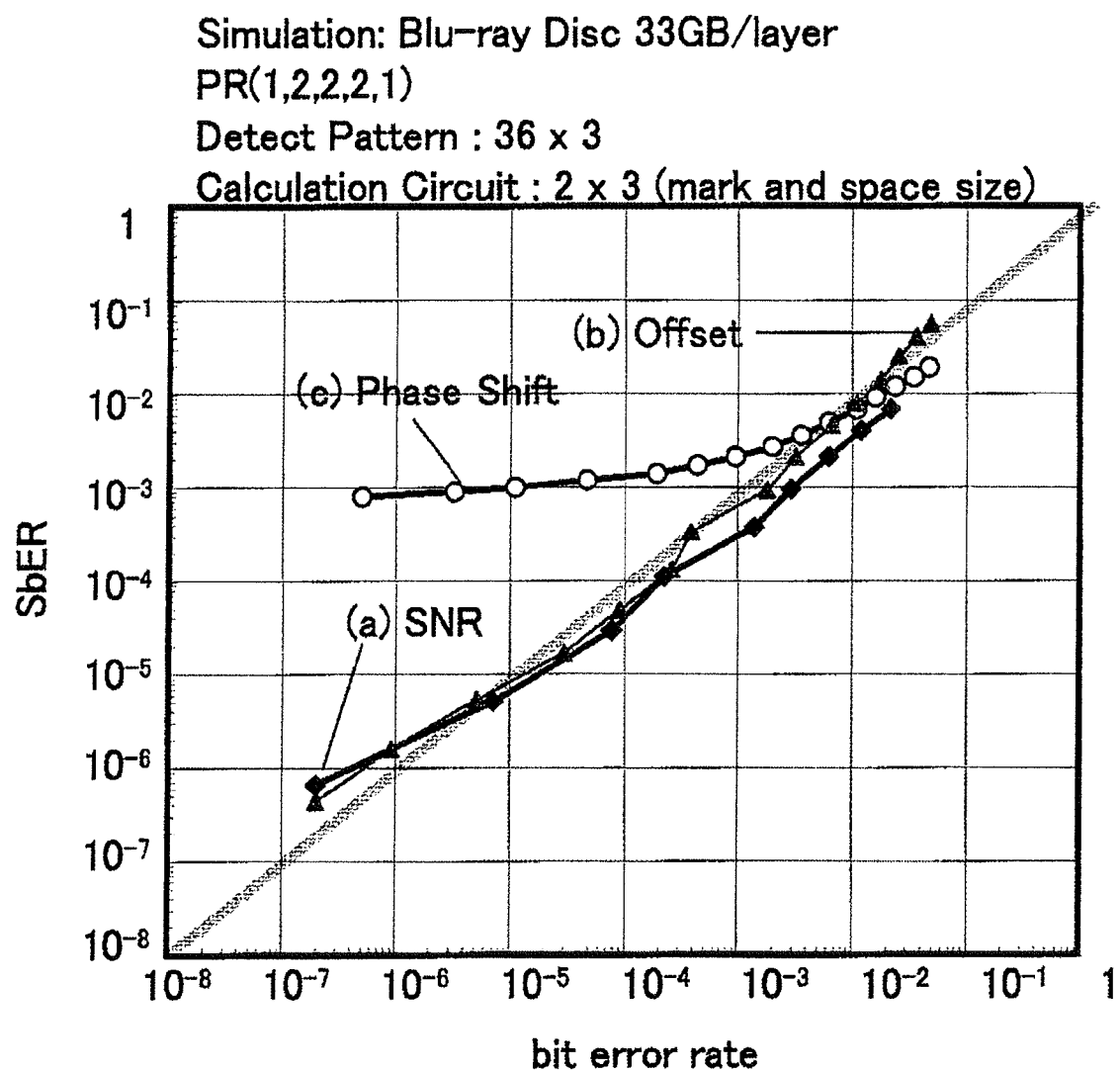
FIG. 26 is a diagram showing a correlation between a bit error rate and SbER.

FIG. 26 shows a result of simulation. Although it is seen from the figure that the bit error rate and the SbER have a good correlation for (a) SNR and (b) offset, the SbER has an increased error of up to 1000 times for (c) phase shift. This is because the grouping that reflects the result of FIG. 24C and focuses on the size of the mark depends on the process of combining two phase shift-split distributions together calculating an average and a standard deviation. This method is very effective for simplifying the circuit but has a disadvantage that, where there is a phase shift (corresponding to the residual edge shift), this method, when used in the evaluation of quality of reproduced signals, results in the bit error rate and the SbER error becoming large.

(3) 54 Evaluation Bitstreams Independence

For grouping evaluation bitstreams, a method may be used that combines two separate evaluation procedures, one for evaluating from the first evaluation bitstreams to the second evaluation bitstreams and one for evaluating in a reverse order. Since these have a strong evaluation bitstream correlation, good evaluation values are considered achievable. The circuit size is reduced to one-half the size required when all evaluation bitstreams are independently processed.

Figure 27:
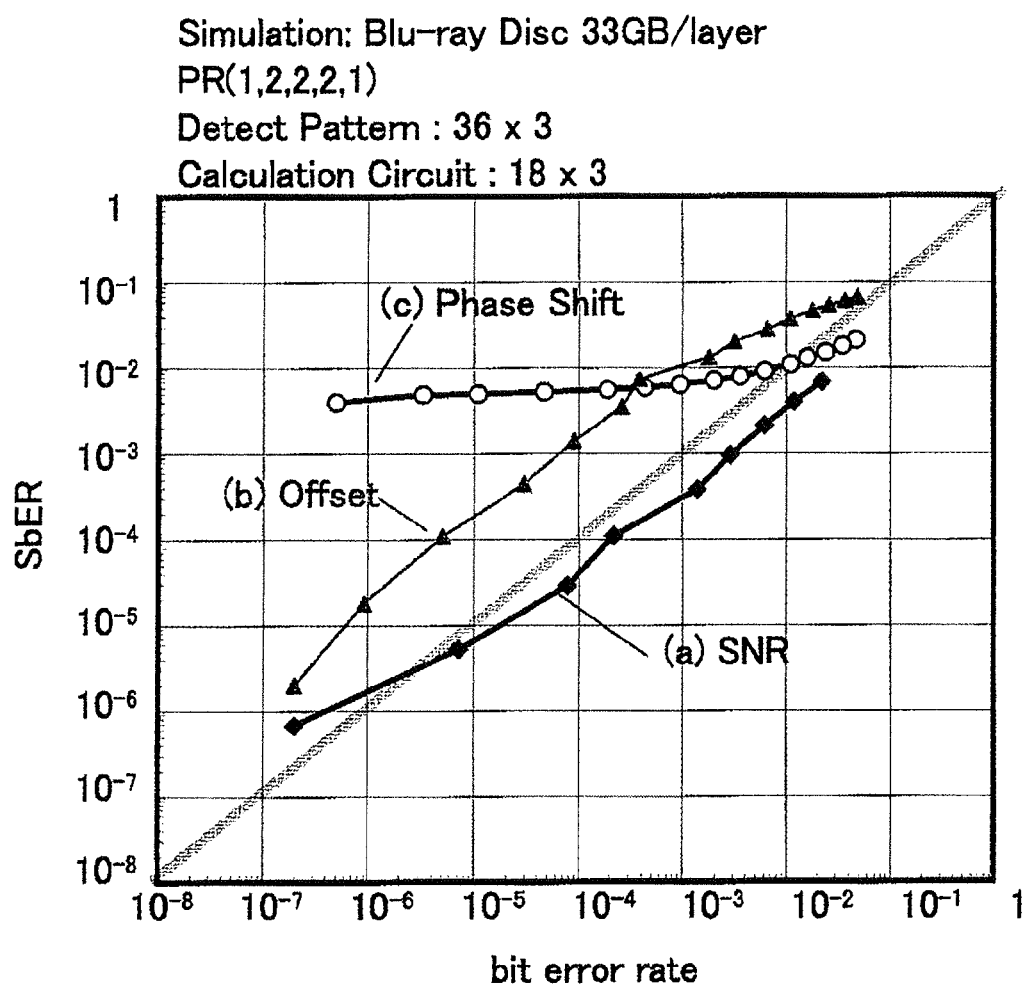
FIG. 27 is a diagram showing a correlation between a bit error rate and SbER (54 separate patterns).

FIG. 27 shows a result of simulation. As shown in the figure, contrary to our expectation, there is a good correlation between the bit error rate and the SbER for all of (a) SNR, (b) offset and (c) phase shift. This is explained as follows. Since the errors between the first evaluation bitstreams and the second evaluation bitstreams correspond to the edge or mark shifting to left or right, when these evaluation bitstreams are grouped, the distributions that have split based on the offset or phase shift are treated as one distribution, in which condition an average and a standard deviation are calculated.

(4) 12 Groups Independence depending on Main Bitstreams

This constitutes the most important among the grouping methods of this embodiment and is a process that divides the main bitstreams into a total of 12 groups of four, one group for each Hamming distance, to calculate the SbER for each group independently. As shown in FIGS. 24A-24C, this method can cope with the offset and the phase shift (corresponding to asymmetry and residual edge shift). The circuit size is reduced to 1/9 the size required when all evaluation bitstreams are handled independently. This grouping method based on the main bitstreams according to this embodiment is expected to provide a good correlation between the bit error rate and the SbER for all of (a) SNR, (b) offset and (c) phase shift.

Figure 28:
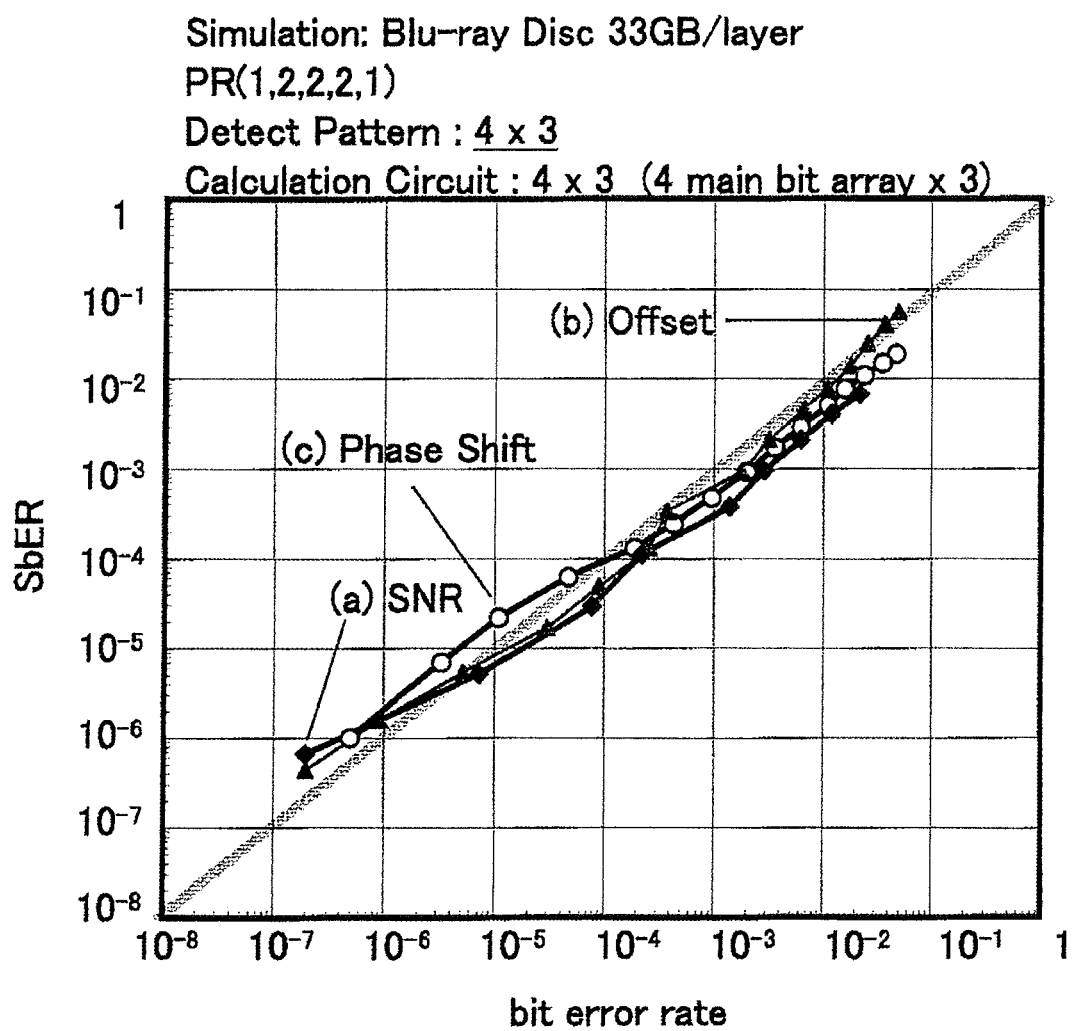
FIG. 28 is a diagram showing a correlation between a bit error rate and SbER in this embodiment (classified based on main bitstreams).

FIG. 28 shows a result of simulation. As shown in the figure, it has been verified that the bit error rate and the SbER have a good correlation for all of (a) SNR, (b) offset and (c) phase shift. Despite the circuit size being reduced to 1/9, a correlation as good as that achieved when all 108 evaluation bitstreams are calculated independently has been shown to be obtainable.

The reproduced signal evaluation method of this embodiment will be described in more detail.

In the foregoing discussion, the advantages of this embodiment have been described for Hamming distance 1, 2, 3, i.e., for cases where the number of 2T's contained in the evaluation bitstreams is 0, 1, 2. Although the number of 2T's appearing successively in modulation codes, including the BD format, is limited, up to about six 2T's may in some cases occur in succession. Therefore, for the purpose of providing a reliable method of evaluating reproduced signals, it is necessary to clarify up to how many successive 2T's it is appropriate to evaluate.

Figure 29:
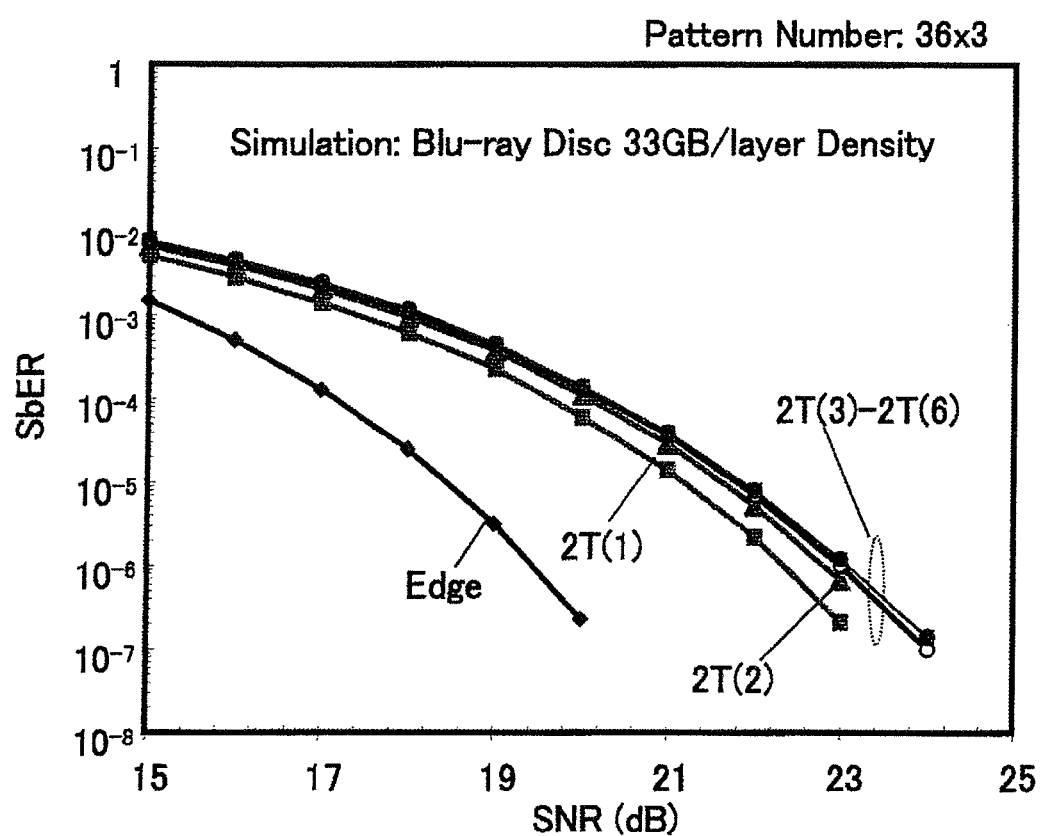
FIG. 29 is a diagram showing a relation between the number of successive 2T's and SbER.

FIG. 29 is a result of simulation showing the relation between SNR and SbER. The simulation conditions are the same as described above and the calculations were done for the numbers of successive 2T's appearing in the evaluation bitstreams 0, 1, 2, 3, 4, 5, 6. The SbER value calculation process in the figure did not perform the main bitstream grouping but summed up SbER values calculated individually for all (36×6) evaluation bitstreams. The result in the figure shows that, for the number of successive 2T's of 2 or greater, the SbER value progressively approaches a fixed value. Therefore, evaluating the bitstreams for up to two successive 2T's can be said to be appropriate in terms of a balance between the reproduced signal evaluation performance and the size of circuit to be implemented.

For the execution of this simulation, the evaluation bitstreams of FIG. 30 were used. This table is the evaluation bitstream table of FIG. 22 with the number of successive 2T's extended to six. When reproduced signals are evaluated according to this embodiment and if the reproduction performance is given priority, the evaluation bitstream table of FIG. 30 may be used to evaluate bitstreams also for the successive 2T's count of 3, 4, 5, 6, i.e., Hamming distance of 4, 5, 6, 7.

Figure 31:
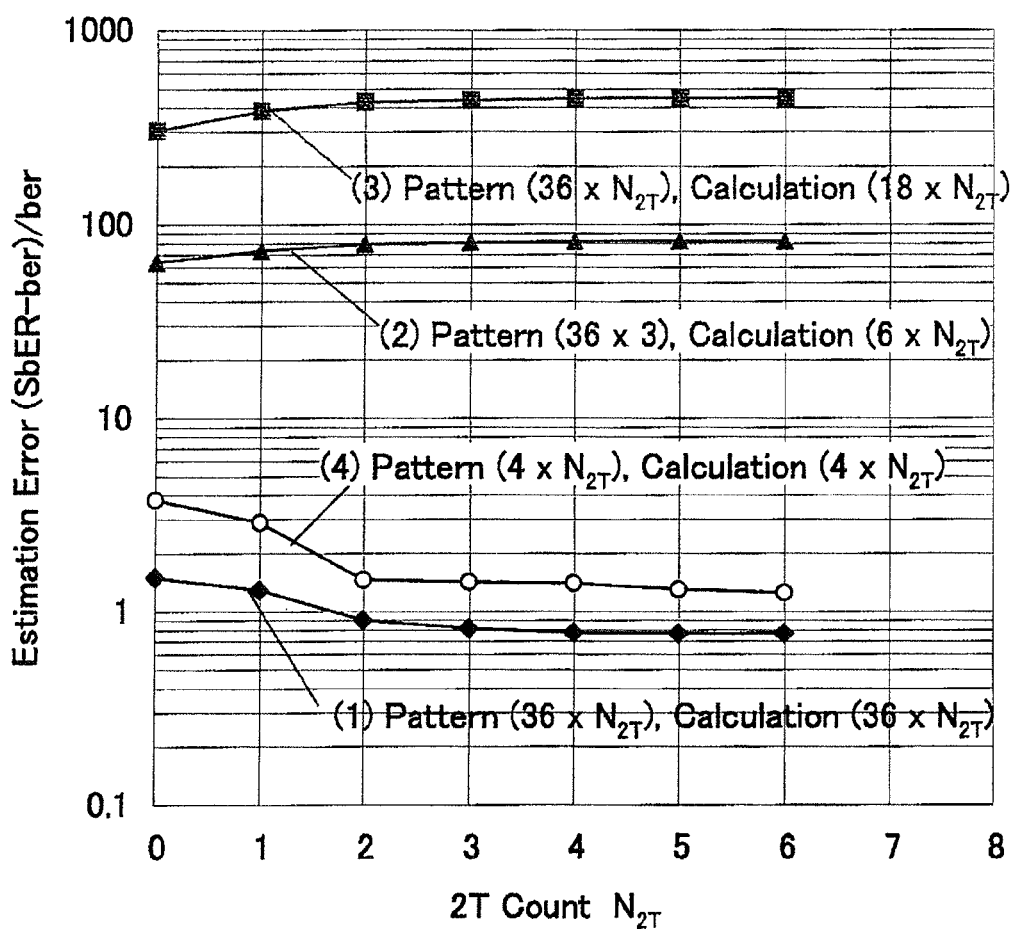
FIG. 31 is a diagram showing a relation between the number of successive 2T's and SbER miscalculation.

FIG. 31 shows a relationship between the number of successive 2T's appearing in the evaluation bitstreams and the SbER-bit error rate that was calculated for the SNR, offset and phase shift as described above. Here is shown a result of comparison among the aforementioned four methods of grouping the SbER calculations. In the case of (1) Calculating all evaluation bitstreams independently and (4) Calculating in 4 groups of main bitstreams, the figure shows that the error between the bit error rate and the SbER decreases as the number of successive 2T's appearing in the evaluation bitstreams increases. It is also seen that the evaluation for up to two successive 2T's is considered good in terms of a balance between the reproduced signal evaluation performance and the size of circuit to be implemented.

Figure 11:
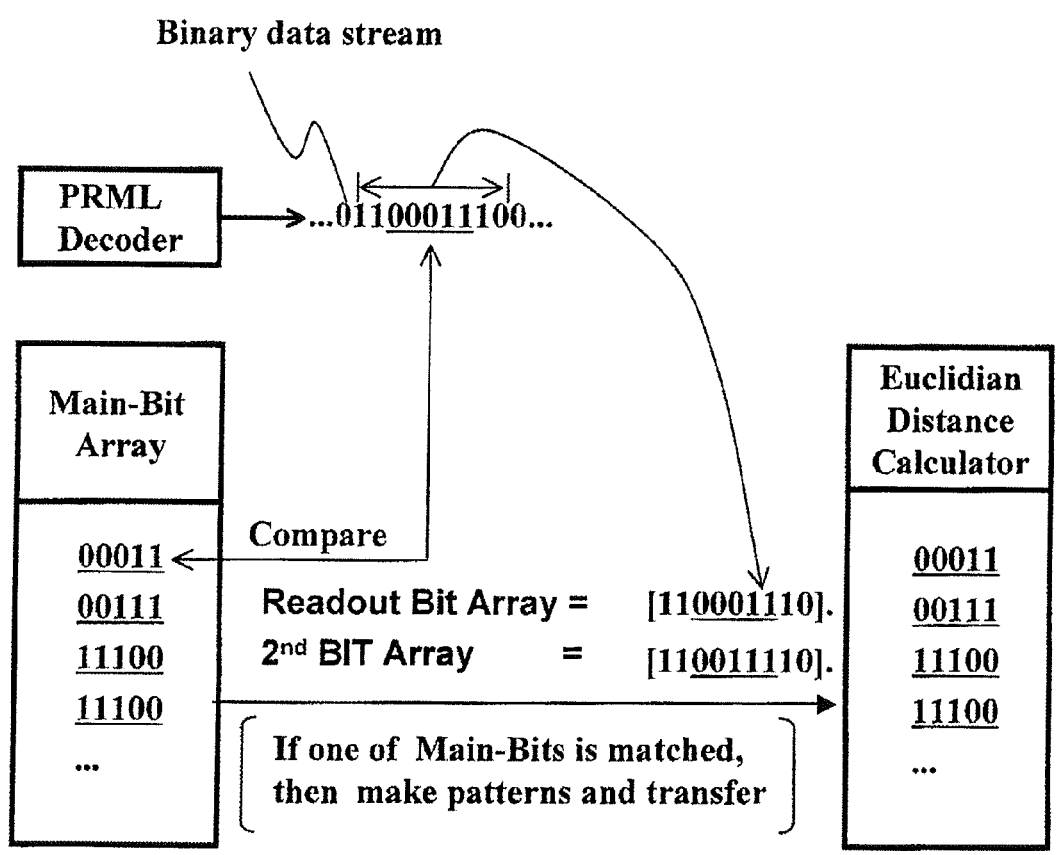
FIG. 11 is a schematic diagram for a method of simplifying an evaluation bitstream pattern check.

The evaluation bitstream checking method according to this embodiment is the same as explained with reference to FIG. 11. In the foregoing explanation, the binarized signals generated by the PRML method conforming to the shortest run length of 2T have been described to automatically satisfy a run length limitation. In general cases for evaluating the quality of reproduced signals, this premise is correct. However, in a case where the reproduced signal evaluation is performed with an optical disc medium containing defects, a path merge may not be completed depending on the length of a path memory in the PRML circuit. In that case, the binarized signal may contain 1T and therefore even if the main bitstream matches, when the sub bitstreams at the ends are included, the bitstream fails to meet the run length limitation. Depending on the implemented configuration of the SbER calculation circuit, operation failures may result. In such cases, what needs to be done is to check whether the first and second evaluation bitstream conform to the run length limitation rule and, if it fails to meet the run length limitation, not to perform the data transfer to the SbER calculation circuit. A simplest method for realizing it is shown in FIG. 21. That is, three bits composed of a 2-bit sub bitstream and a 1-bit main bitstream are examined; and when this 3-bit bitstream matches "010" or "101", it should be decided that the bitstream fails to meet the run length limitation. Since the sub bitstreams do not depend on the Hamming distance as described above, at least one such decision circuit needs only to be added. In cases where a plurality of evaluation bitstreams are evaluated parallelly depending on the implemented circuit configuration, as may "010" or "101" decision circuits as required may be provided.

Next, another example of the grouping method for the SbER calculation in this embodiment will be explained.

Figure 33:
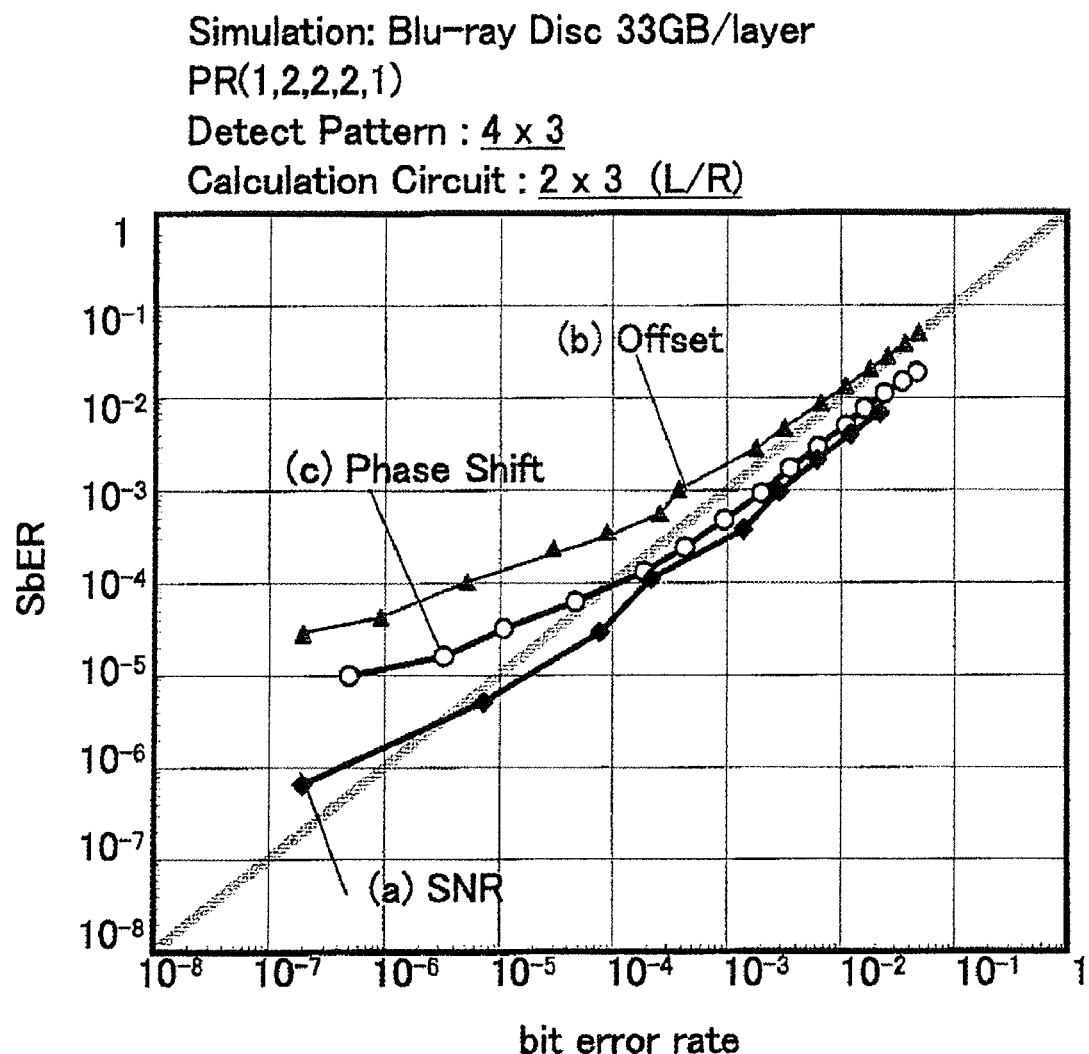
FIG. 33 is a diagram showing a correlation between a bit error rate and SbER (classified based on shift direction).

FIG. 32 is a table of evaluation bitstreams prepared by classifying the evaluation bitstreams of FIG. 22 into groups of the left shift and the right shift. When the main bitstreams are classified by the left shift and right shift, a total of six groups are obtained. FIG. 33 is a result of simulation showing a relation between bit error rate and SbER. Although, where there is (b) offset, the error is shown to be large, it is seen that an overall relation between bit error rate and SbER is relatively good.

Figure 35:
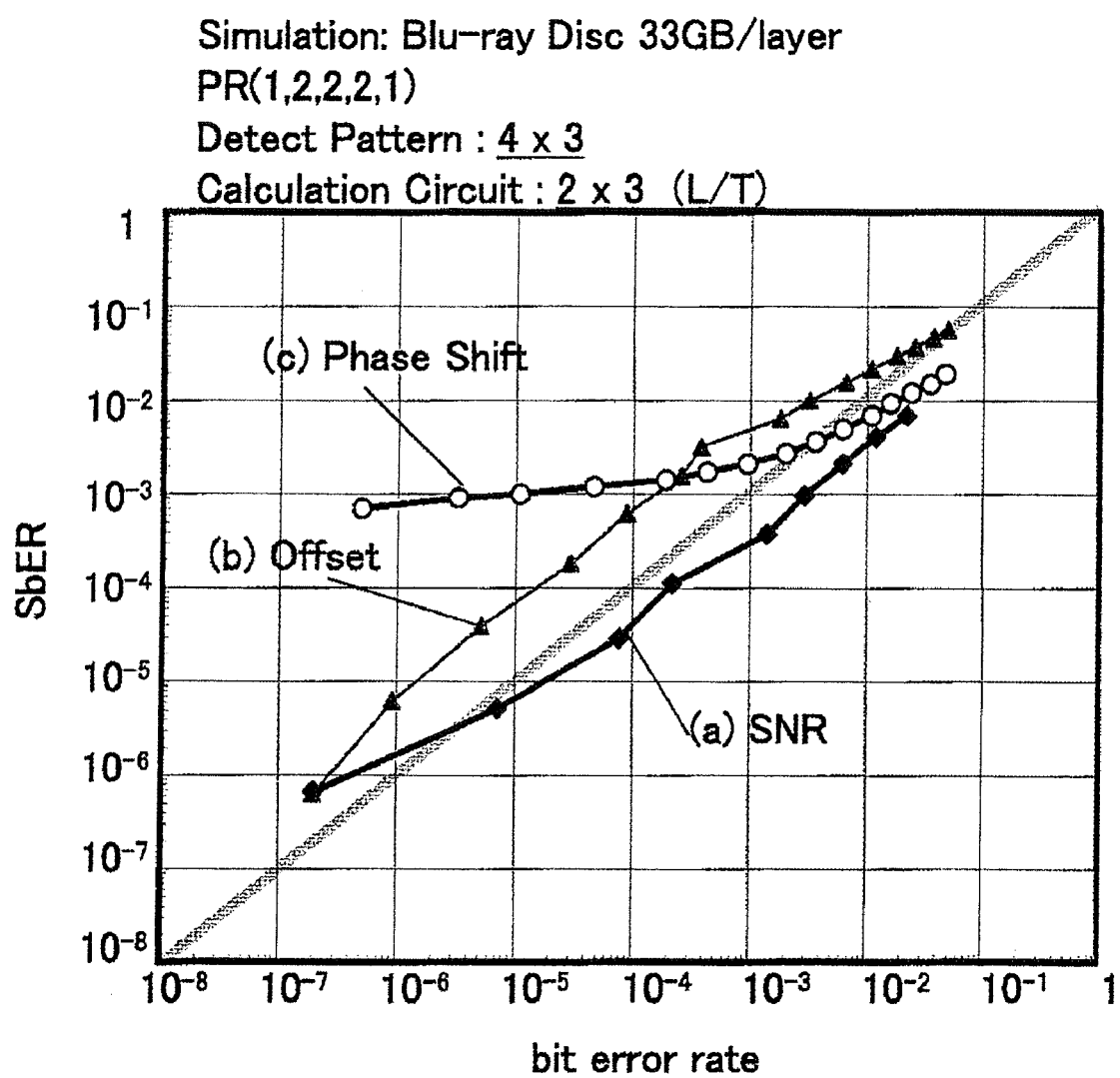
FIG. 35 is a diagram showing a correlation between a bit error rate and SbER (classified based on leading and trailing edge).

FIG. 34 is a table of evaluation bitstreams prepared by classifying the evaluation bitstreams of FIG. 22 into groups of the leading edge and the trailing edge. The total number of groups is six. FIG. 35 is a result of simulation showing a relation between bit error rate and SbER. Although, where there is (c) phase shift, the error is shown to be large, it is understood that an overall relation between bit error rate and SbER is relatively good.

FIG. 36 is an evaluation bitstream table prepared by classifying the evaluation bitstreams of FIG. 22 into a group of direction that increases the mark and a group of direction that reduces it. The simulation result is shown in FIG. 26.

When the meaning of evaluating the main bitstreams and their errors is considered with reference to FIG. 22, three methods are available for classifying the bitstreams into two groups for each Hamming distance. For example, in a case where a circuit offset adjustment learning process that will minimize the SbER as an index is implemented in an optical drive, an index that is sensitive to a change in offset should preferably be used. So, the grouping procedure such as shown in FIG. 32 is effectively used. Similarly, when a recording strategy is adjusted, it is preferred that the classification procedures shown in FIG. 34 and FIG. 36 that are sensitive to phase shifts be used. In these cases, there is no need to use conforming circuits but it is still possible to obtain three approximated SbER values by using calculated results of SbER classified into four groups for each Hamming distance. For example, if, for two given main bitstreams, an average value and a standard deviation are calculated to be a1, a2 and σ1, σ2, respectively, an average value a and a standard deviation σ, when the two main bitstreams are grouped together, can be approximated by the following equation according to a combination of Gauss distributions.

$$a = \frac{a_1 + a_2}{2}$$
$$\sigma = \sqrt{\sigma_1^2 + \sigma_2^2 + (a_1 - a)^2 + (a_2 - a)^2}$$

Equation 1

As described above, with this embodiment it is possible to calculate SbER value with high precision by using a method of classifying evaluation bitstreams into groups of four main bitstreams for each Hamming distance to determine an average and a dispersion of D values and then by adding up all results; and in a case of a learning process, it is also possible to determine from (Equation 1) a combined average and a combined standard deviation for two given main bitstreams. For the sake of simplicity of explanation, the numbers of events to be measured in two distributions have been described to be practically equal in (Equation 1). However, in the process of combining Gauss distributions, it is a known fact that these event numbers need to be considered in determining an average and a standard deviation of a combined distribution.

Next, a result of simulation using the evaluation method of this embodiment will be explained when data is recorded and reproduced to and from an actual optical disc with a density equivalent to 33 GB of capacity. As for a medium, a 3-layer disc having an alloy recording film was used. A BD-compatible evaluation apparatus, LM330A of Shibasoku make, was used in the test. The speed of recording and reading is BD double speed.

Figure 37:
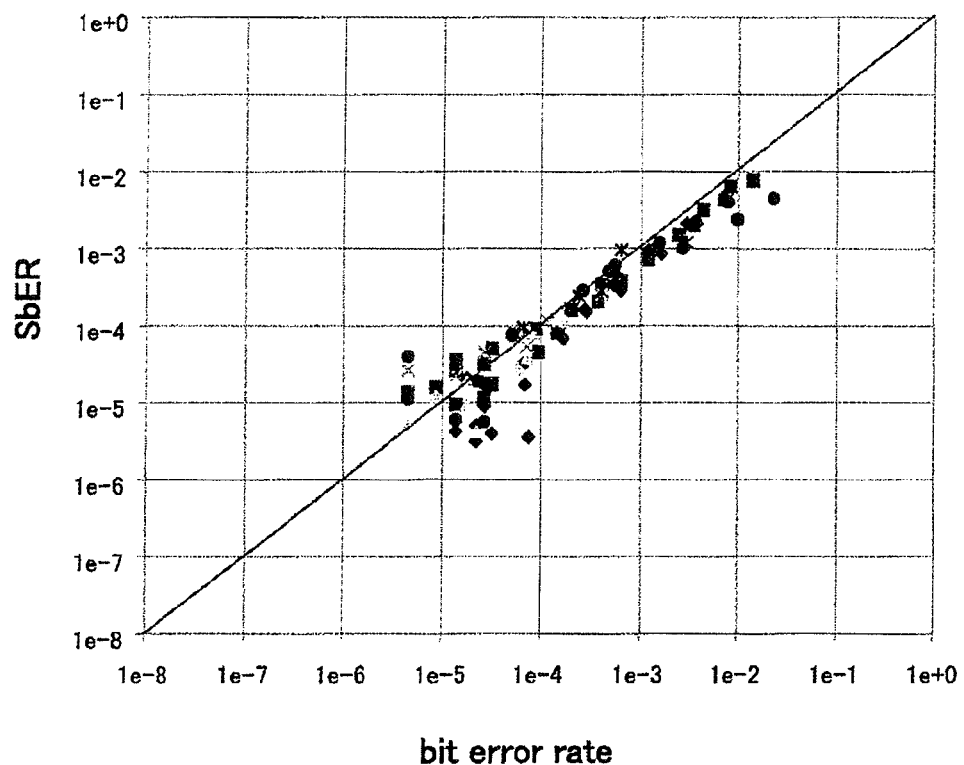
FIG. 37 is a diagram showing test results on bit error rates and SbER.

FIG. 37 is a result of the test showing a relation between bit error rate and SbER. In this test, the recording operation was performed on five successive tracks, with various stresses impressed on the center track so that data obtained includes influences of crosstalk. Among the stresses impressed are disc radial tilts (R-tilt), tangential tilts (T-tilt), focus shifts (AF), spherical aberrations caused by an operation of optical head beam expander (SA), and recording power changes (Pw). More specifically, the radial tilt is (R-tilt (2T Shift)) in which residual shifts of 2T mark are increased by the recording strategy. The main bitstream-based grouping is a classification into four groups as shown in FIG. 22. The bit error rate and the SbER exhibit a good agreement, as shown, and it is verified that this method has a high enough reproduced signal evaluation performance. It is noted here that large variations seen around the bit error rate of $10^{-5}$ is primarily the result of influences from defects of the medium.

Figure 38:
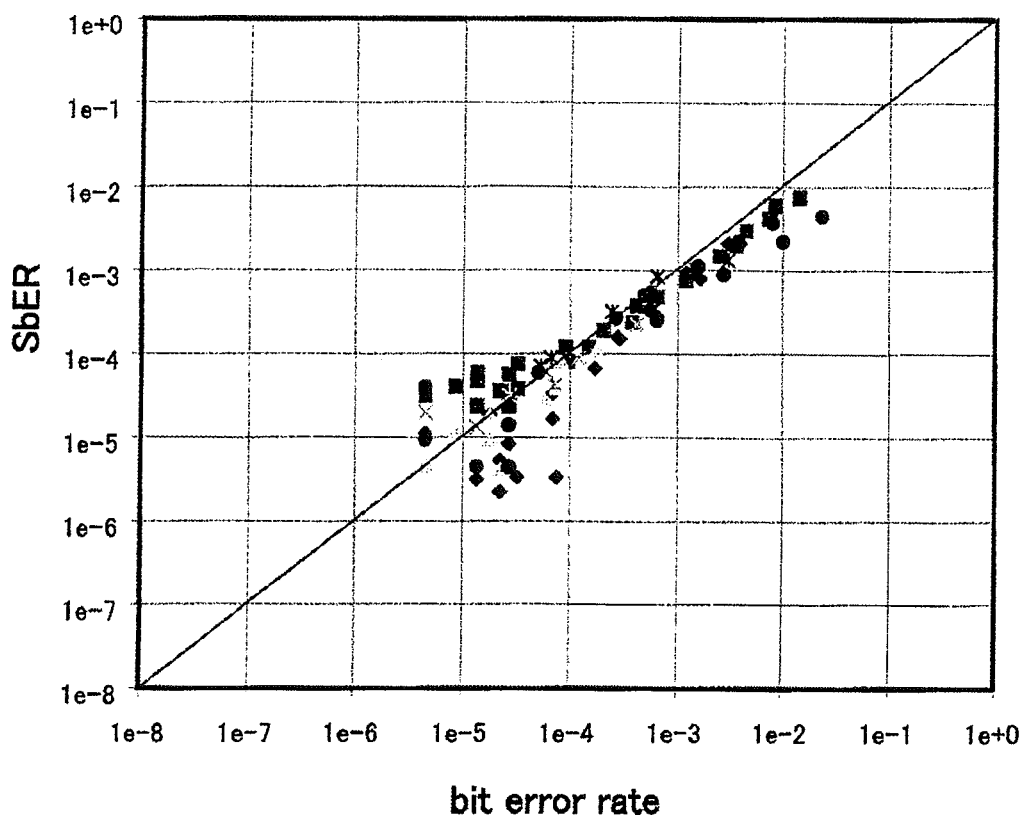
FIG. 38 is a diagram showing test results on bit error rates and SbER.

FIG. 38 is a result of a test in which evaluation bitstreams are classified into two groups based on a shift direction according to the evaluation bitstream table of FIG. 32. Although errors are somewhat large compared with the result of FIG. 37, the bit error rate and the SbER exhibit a good correlation.

Figure 39:
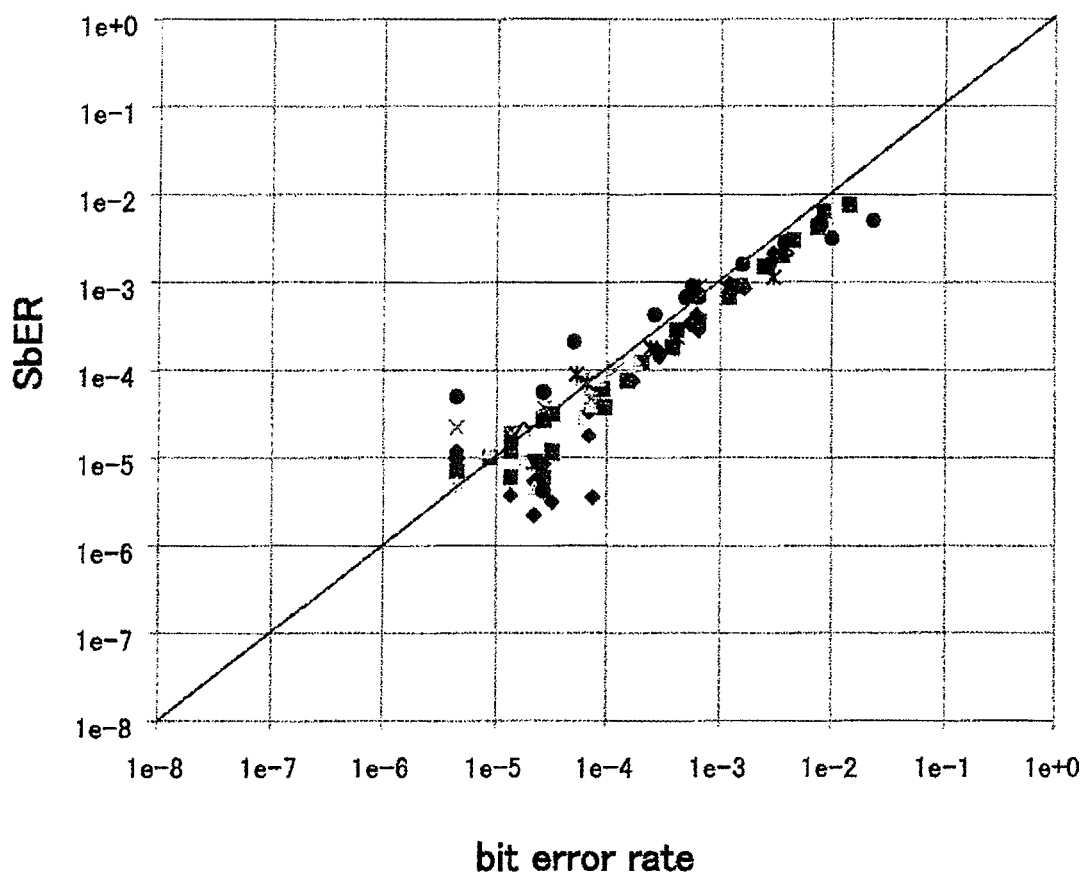
FIG. 39 is a diagram showing test results on bit error rates and SbER.

FIG. 39 is a result of a test in which evaluation bitstreams are classified into two groups based on the leading and trailing edges according to the evaluation bitstream table of FIG. 34. Although errors are somewhat large compared with the result of FIG. 37, the correlation between the bit error rate and the SbER is good.

Figure 40:
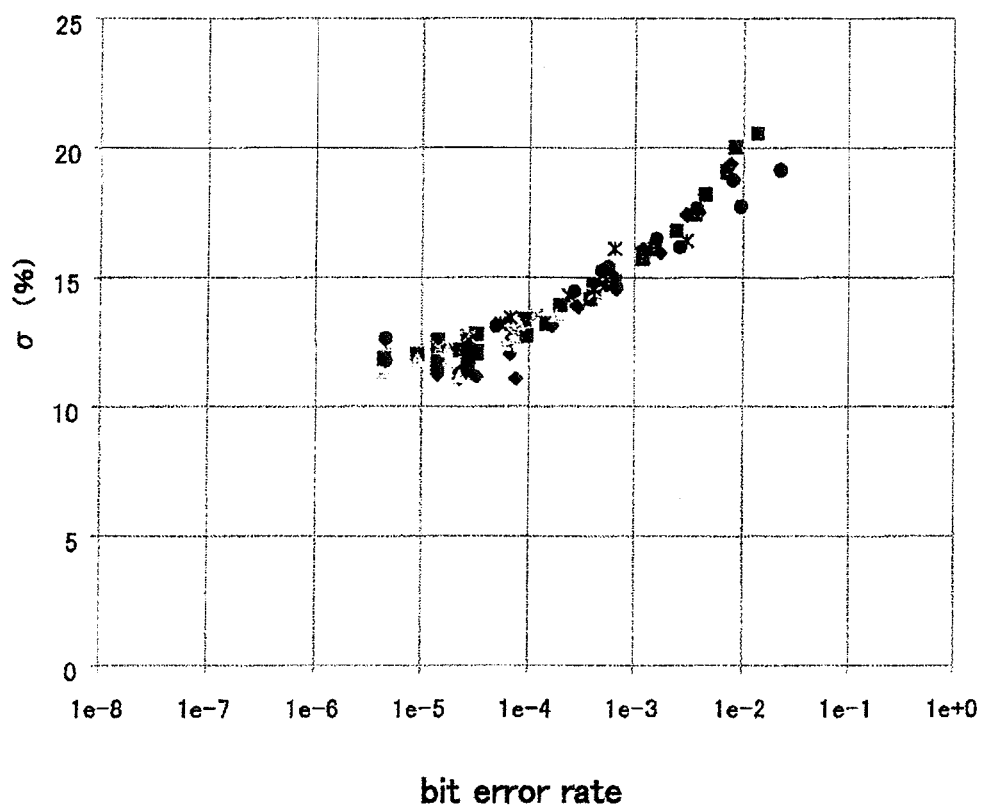
FIG. 40 is a diagram showing test results on bit error rates and synthesized standard deviations.

With the evaluation method of this embodiment, a σ value of a combined Gauss distribution can be determined from averages and standard deviations of four distributions obtained for each Hamming distance. FIG. 40 is a test result showing a relationship between the bit error rate and the σ value of the combined distribution. This can also be used as one of indices that are highly correlated with the bit error.

Figure 41:
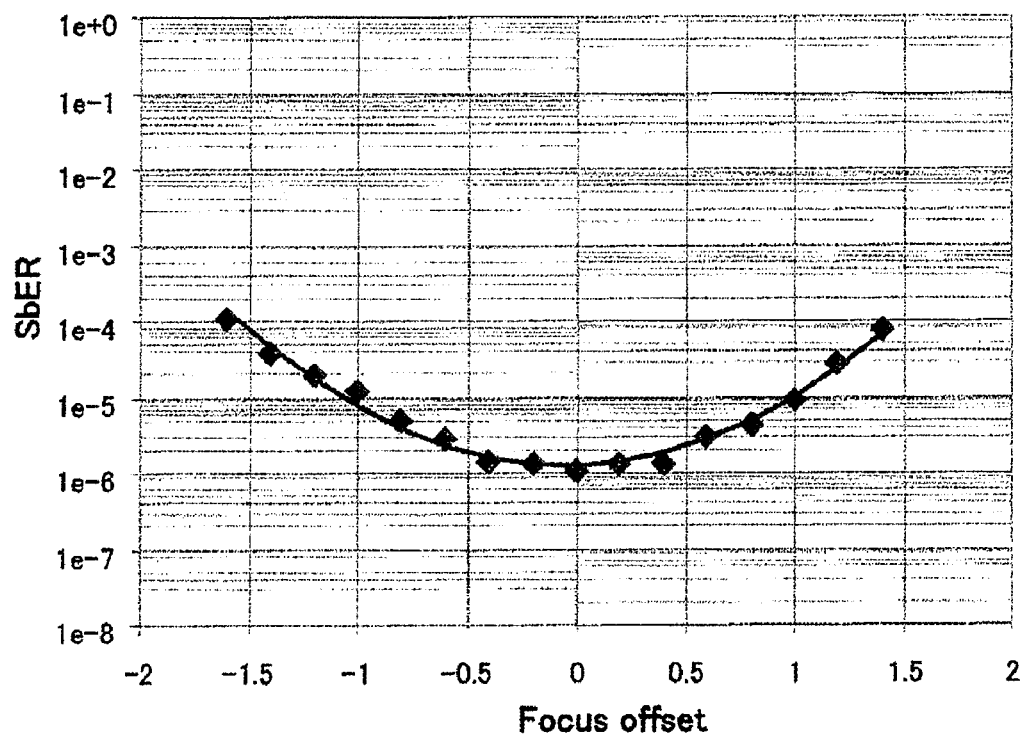
FIG. 41 is a diagram showing a focus adjustment method using the evaluation method of this embodiment.

FIG. 41 is a test result showing a relationship between the amount of focus offset and the SbER obtained by this embodiment. By using this relationship and minimizing the SbER, a learning procedure to determine an appropriate focus offset value can be realized. The similar method can also be applied to learning procedures for radial tilt, tangential tilt, spherical aberration, recording power and many others.

Figure 43:
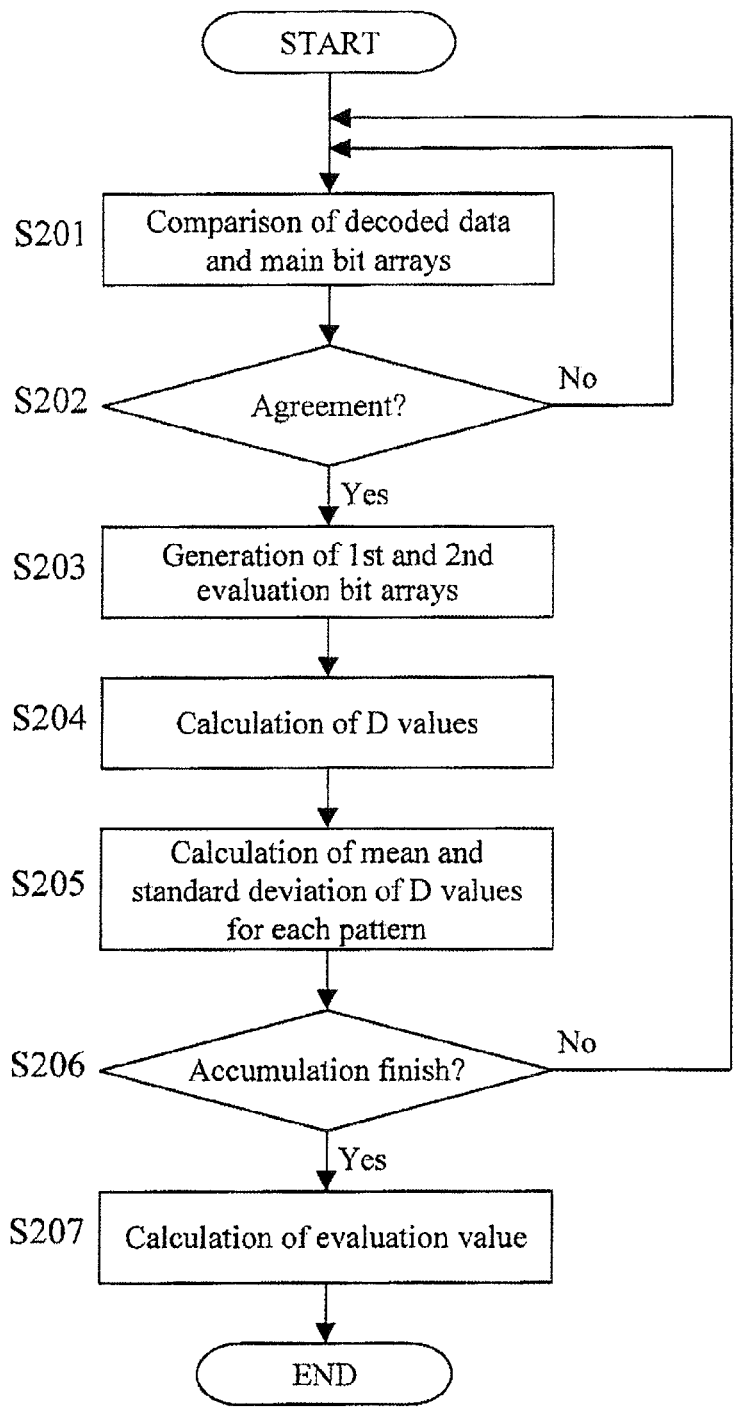
FIG. 43 is a flowchart for evaluating a reproduced signal.

Next, an overall flow of steps in the reproduced signal evaluation method of this embodiment will be explained by referring to a flow chart of FIG. 43. First, a binarized signal output from the PRML decoder and main bitstreams are compared (S201). A check is made as to whether the binarized signal includes one of the main bitstreams (S202). If none is included (No), the program returns to step S201 where it continues processing. If a main bitstream is included (Yes), the program executes the processing explained in FIG. 11 to generate a first evaluation bitstream and a second evaluation bitstream (S203). Next, Euclidean distances between target signals of the first and second evaluation bitstreams and an equalized reproduced signal are calculated to determine a difference between them, or a D value (S204). The D values obtained here are accumulated according to the main bitstreams evaluated, and are used to calculate an average and a standard deviation (S205). It is checked whether acquisition of a required quantity of data has been finished (S206). If not (No), the program returns to S201 where it continues processing. If it is found to be finished (Yes), the program moves to step S205 where it combines the average and the standard deviation of D values calculated for each main bitstream to calculate an evaluation value of the reproduced signal (S207).

Now, an example overall configuration of the optical disc drive of this embodiment will be explained.

Figure 1:
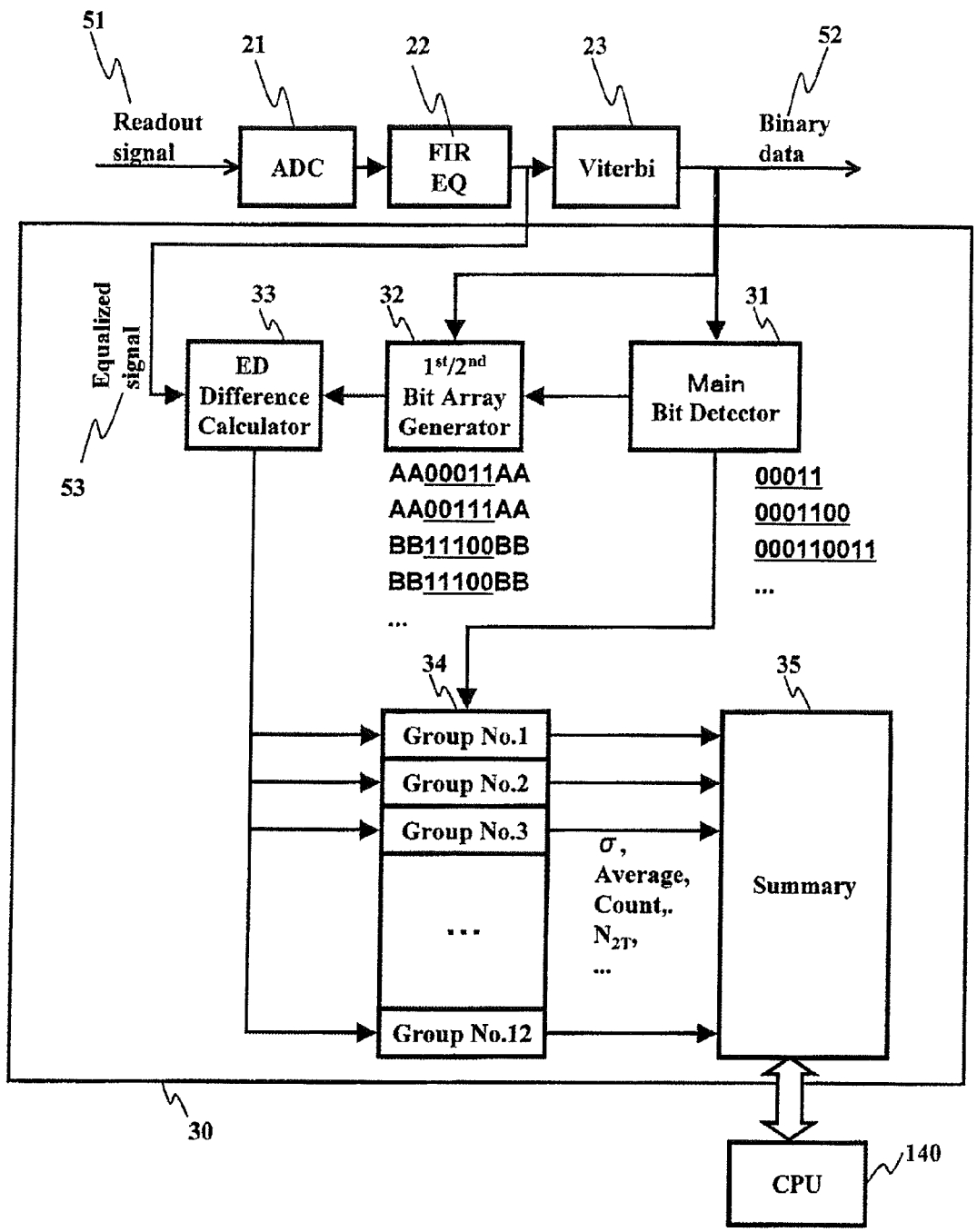
FIG. 1 is a block diagram showing a circuit configuration for implementing a reproduced signal evaluation method according to one embodiment.
Figure 4:
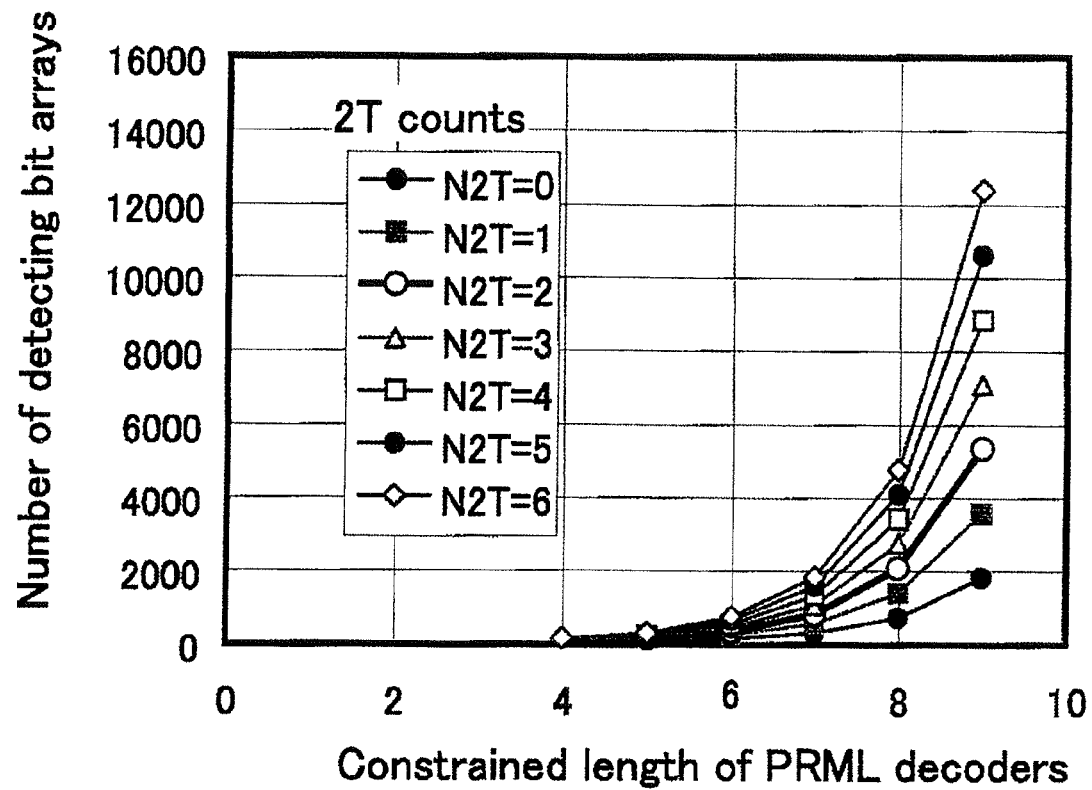
FIG. 4 is a graph showing a relation between a restraint length and the number of evaluation bitstreams.

FIG. 1 shows a configuration of a reproduced signal evaluation circuit to realize the optical disc drive of this embodiment. In the figure, a reproduced signal 51, that was read from an optical disc medium and subjected to an analog filter processing not shown, is converted by an A/D converter 21 into 6- to 8-bit digital data, which is equalized by an automatic equalizer 22 and then binarized by a PRML decoder 23 before the binarized data 52 is output. An evaluation circuit 30 of this embodiment to evaluate the quality of the reproduced signal comprises a main bitstream check circuit 31, an evaluation bitstream generation circuit 32, a Euclidean distance calculation circuit 33, a group-based D value memory 34 and an evaluation value summing circuit 35. The main bitstream check circuit 31 stores main bitstream data and checks whether the binarized signal 52 includes the main bitstreams. If the binarized signal 52 includes main bitstreams, the evaluation bitstream generation circuit 32 executes processing explained in FIG. 11 to generate a first evaluation bitstream and a second evaluation bitstream. The Euclidean distance calculation circuit 33 calculates Euclidean distances between target signals of the first evaluation bitstream and the second evaluation bitstream and an equalized reproduced signal 53 output from the automatic equalizer 22 and determines a D value, a difference between the Euclidean distances. The D value obtained here is sent to the group-based D value memory 34 where it is accumulated according to the main bitstream checked by the main bitstream check circuit 31 and is used to calculate an average and a standard deviation. The evaluation value summing circuit 35 combines these results to calculate an evaluation result of the reproduced signal and, in response to an instruction, transfers the result to a CPU 140. Examples of evaluation result may include SbER. The CPU 140 may, while changing a focus offset for example, evaluate the quality of the reproduced signal and execute a focus offset learning process in a way that maximizes the quality. With this configuration, it is possible to manufacture a circuit that implements the reproduced signal evaluation method of this embodiment.

Figure 42:
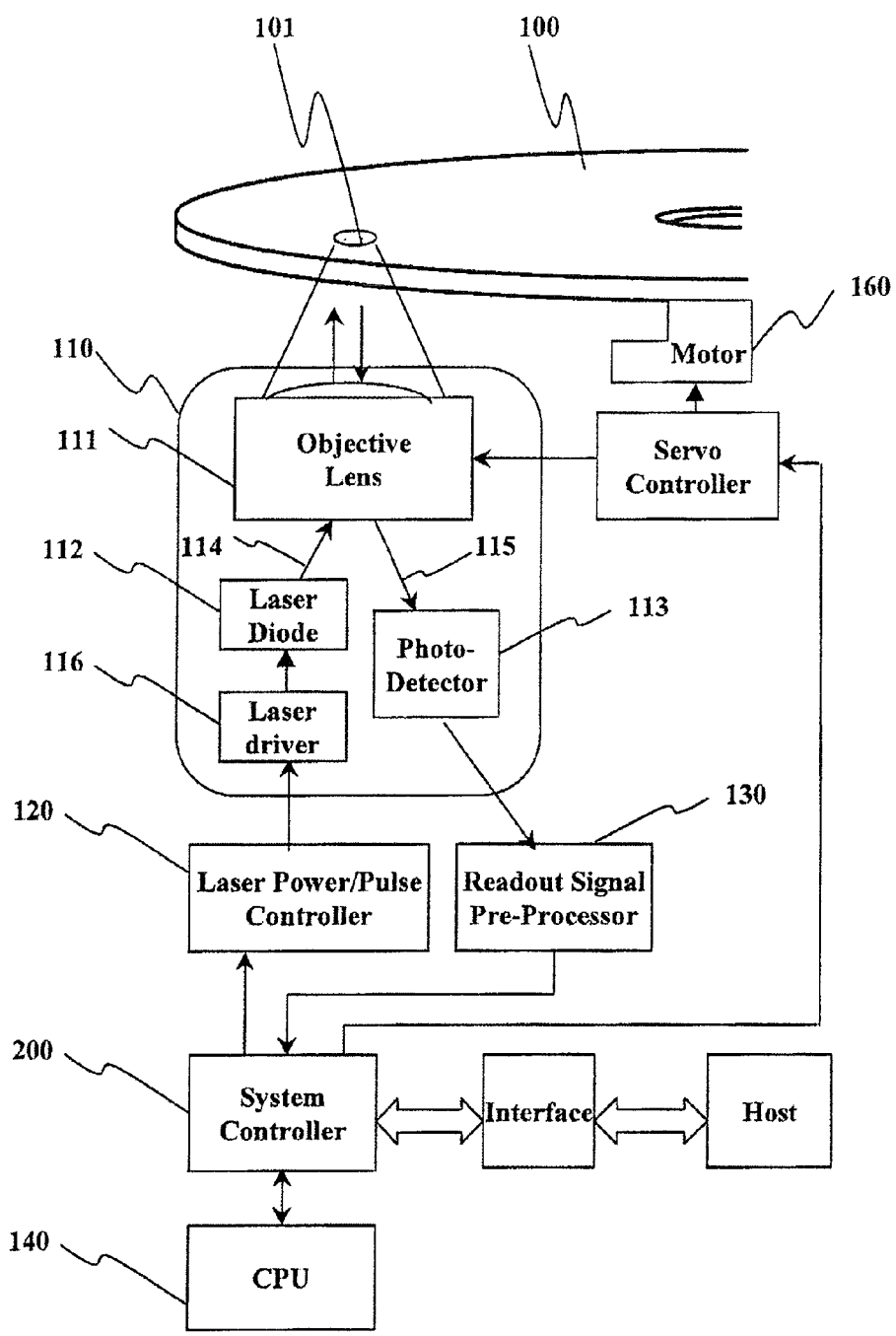
FIG. 42 is a schematic diagram showing an overall construction of an optical disc drive.

Lastly, a configuration of the optical disc drive suitable for implementing this embodiment will be described. FIG. 42 is a schematic diagram showing an example configuration of an optical disc drive that implements the reproduced signal evaluation method of this embodiment. An optical disc medium 100 put in the drive is rotated by a spindle motor 160. During playback, a laser power/pulse controller 120 controls a current flowing in a semiconductor laser 112 through a laser driver 116 to produce a laser beam 114 that has a level of light intensity demanded by the CPU 140. The laser beam 114 is focused by an object lens 111 to form a beam spot 101 on the optical disc medium 100. A light 115 reflected from the beam spot 101 through the object lens 111 is detected by an optical detector 113. The optical detector comprises a plurality of divided optical sensor elements. A reproduced signal processing circuit 130 reproduces information recorded in the optical disc medium 100 by using signals detected by an optical head 110. With this construction, the optical disc drive of this embodiment capable of handling BD's of 30 GB or higher can implement the evaluation of reproduced signals and a variety of learning functions using it.

This embodiment relates to a method of evaluating reproduced signals from a large-capacity optical disc and to an optical disc drive and is intended for use in those optical disc drives with a capacity of 30 GB or higher in each layer.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A reproduced signal evaluation method employed in a decoding operation, wherein the decoding operation uses a PRML method that decodes binarized bitstreams generated from reproduced signals obtained from an information-recorded medium, wherein the PRML method involves generating a plurality of evaluation bitstreams describing a state to which a current binarized bitstream will change, evaluating for each of the plurality of evaluation bitstreams a likelihood with which the current binarized bitstream will change to the evaluation bitstreams, determining the binarized bitstream after the state change and repeating the determination procedure to decode the reproduced signals;

wherein the evaluation bitstreams are expressed as a combination of a main bitstream and sub bitstreams, the sub bitstreams being added to both of front and rear end of the main bitstream;

wherein, in executing the decoding operation, the reproduced signal evaluation method generates a first evaluation bitstream corresponding to a most likely first state change and a second evaluation bitstream corresponding to a second most likely second state change;

in generating a first evaluation bitstream and the second evaluation bitstream, prepares in advance a plurality of bit patterns describing the main bitstream;

compares the main bitstreams and a part of the current binarized bitstream and selects from among the plurality of bit patterns a first main bitstream applicable to the first evaluation bitstream;

executes an exclusive-OR calculation on the main bitstream applicable to the first evaluation bitstream to generate a second main bitstream applicable to the second evaluation bitstream; and attaching the sub bitstreams to the first main bitstream and the second main bitstream to generate the first evaluation bitstream and the second evaluation bitstream.

2. A reproduced signal evaluation method according to claim 1, wherein the main bitstream is determined by the number of shortest run lengths appearing successively in the binarized bitstreams and a Hamming distance between binarized bitstreams before and after the state change.

3. A optical disc drive comprising:

reproduced signals acquisition means; and a binarized bitstream acquisition means to decode the reproduced signals to time-sequentially acquire binarized bitstreams by using a PRML method, the PRML method comparing the reproduced signals from an information-recorded medium and target signals in a plurality of state changes and selecting a most likely state change;

wherein the evaluation bitstreams are expressed as a combination of a main bitstream and sub bitstreams, the sub bitstreams being added to both of front and rear end of the main bitstream;

wherein, in executing the decoding operation, a first evaluation bitstream corresponding to a most likely first state change and a second evaluation bitstream corresponding to a second most likely second state change are generated; and wherein, in generating the first evaluation bitstream and the second evaluation bitstream, a plurality of bit patterns describing the main bitstream are prepared in advance; the main bitstreams and a part of the current binarized bitstream are compared; and from among the plurality of bit patterns a first main bitstream applicable to the first evaluation bitstream is selected; and wherein an exclusive-OR calculation on the main bitstream applicable to the first evaluation bitstream to generate a second main bitstream applicable to the second evaluation bitstream is executed.

4. A reproduced signal evaluation method employed in a decoding operation, comprising:

generating a first evaluation bitstream corresponding to a most likely first state change and a second evaluation bitstream corresponding to a second most likely second state change, which includes preparing in advance a plurality of bit patterns describing the main bitstream, and wherein the evaluation bitstreams are expressed as a combination of a main bitstream and sub-bitstreams, the sub-bitstreams being added to both of front and rear end of the main-bitstream;

comparing the main-bitstreams and a part of the current binarized bitstream, and selecting from among the plurality of bit patterns a first main-bitstream applicable to the first evaluation bitstream;

executing an exclusive-OR calculation on the main-bitstream applicable to the first evaluation bitstream to generate a second main-bitstream applicable to the second evaluation bitstream; and attaching the sub-bitstreams to the first main-bitstream and the second main-bitstream to generate the first evaluation bitstream and the second evaluation bitstream;

wherein the decoding operation uses a PRML method that decodes binarized bitstreams generated from reproduced signals obtained from an information-recorded medium;

wherein the PRML method involves generating a plurality of evaluation bitstreams describing a state to which a current binarized bitstream will change, evaluating for each of the plurality of evaluation bitstreams a likelihood with which the current binarized bitstream will change to the evaluation bitstreams, determining the binarized bitstream after the state change and repeating the determination procedure to decode the reproduced signals.

5. A reproduced signal evaluation method according to claim 1, wherein the main-bitstream is determined by the number of shortest run lengths appearing successively in the binarized bitstreams and a Hamming distance between binarized bitstreams before and after the state change.

6. A optical disc drive comprising:

at least one reproduced signals acquisition means to acquire reproduced signals; and a binarized bitstream acquisition means to decode the reproduced signals to time-sequentially acquire binarized bitstreams by using a PRML method, the PRML method comparing the reproduced signals from an information-recorded medium and target signals in a plurality of state changes and selecting a most likely state change;

wherein the evaluation bitstreams are expressed as a combination of a main-bitstream and sub-bitstreams, the sub-bitstreams being added to both of front and rear end of the main-bitstream;

wherein, in executing the decoding operation, a first evaluation bitstream corresponding to a most likely first state change and a second evaluation bitstream corresponding to a second most likely second state change are generated;

wherein, in generating the first evaluation bitstream and the second evaluation bitstream, a plurality of bit patterns describing the main-bitstream are prepared in advance; the main-bitstreams and a part of the current binarized bitstream are compared; and from among the plurality of bit patterns a first main-bitstream applicable to the first evaluation bitstream is selected; and wherein an exclusive-OR calculation on the main-bitstream applicable to the first evaluation bitstream to generate a second main-bitstream applicable to the second evaluation bitstream is executed.

* * * * *